US012612549B2

(12) United States Patent (10) Patent No.: US 12,612,549 B2
Murazaki (45) Date of Patent: Apr. 28, 2026

(54) OXIDE FLUORESCENT MATERIAL, LIGHT EMITTING DEVICE, AND METHOD FOR PRODUCING OXIDE FLUORESCENT MATERIAL

(71) Applicant: NICHIA CORPORATION, Anan (JP)

(72) Inventor: Yoshinori Murazaki, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 888 days.

(21) Appl. No.: 17/538,158

(22) Filed: Nov. 30, 2021

(65) Prior Publication Data

US 2022/0169923 A1 Jun. 2, 2022

(30) Foreign Application Priority Data

Nov. 30, 2020 (JP) ................................. 2020-198326
Nov. 1, 2021 (JP) ................................. 2021-178798

(51) Int. Cl.

| | |
|---|---|
| *C09K 11/77* | (2006.01) |
| *C09K 11/61* | (2006.01) |
| *C09K 11/68* | (2006.01) |
| *H10H 20/851* | (2025.01) |

(52) U.S. Cl.

CPC ........ *C09K 11/7708* (2013.01); *C09K 11/616* (2013.01); *C09K 11/681* (2013.01); *C09K 11/684* (2013.01); *C09K 11/685* (2013.01); *C09K 11/7706* (2013.01); *C09K 11/77062* (2021.01); *C09K 11/77342* (2021.01); *C09K 11/77348* (2021.01); *C09K 11/7739* (2013.01); *C09K 11/7776* (2013.01); *H10H 20/8513* (2025.01)

(58) Field of Classification Search

CPC .......... C09K 11/7708; C09K 11/77348; C09K 11/77062; C09K 11/77342; C09K 11/7706; C09K 11/7739; C09K 11/7776; C09K 11/616; C09K 11/681; C09K 11/684; C09K 11/685; H01L 33/504

See application file for complete search history.

(56) References Cited

U.S. PATENT DOCUMENTS

| | | | |
|---|---|---|---|
| 4,071,465 A * | 1/1978 | Vodoklys ............. | C09K 11/681 |
| | | | 252/301.4 F |
| 10,411,170 B2 | 9/2019 | Tragl et al. | |
| 2018/0358514 A1 * | 12/2018 | Tragl ................... | A61B 1/0653 |
| 2019/0031954 A1 * | 1/2019 | Okura ................... | H01L 33/502 |
| 2020/0048549 A1 * | 2/2020 | Hong ................. | C09K 11/7787 |
| 2020/0205415 A1 | 7/2020 | Okura et al. | |

FOREIGN PATENT DOCUMENTS

| | | | | |
|---|---|---|---|---|
| CN | 104560041 A | 4/2015 | | |
| CN | 111647404 A | 9/2020 | | |
| JP | 2018518046 A | 7/2018 | | |
| JP | 2018145336 A | 9/2018 | | |
| JP | 2020528486 A | 9/2020 | | |
| JP | 2020188044 A | 11/2020 | | |
| WO | WO-2019020653 A1 * | 1/2019 | ............. | A01N 59/00 |
| WO | WO-2019020661 A1 * | 1/2019 | ............. | A01N 59/00 |

OTHER PUBLICATIONS

Zhou, Z., et al., An empirical energy level scheme to predict photoluminescent and long persistent luminescent properties of $Ln^{3+}$doped $NaCa_2GaGe_5O_{14}$ materials, Journal of Luminescence, (2016), pp. 629-632, 4 pages.

B.V. Mill, et al., "Germanates with the Ca3Ga2Ge4O14 Structure" Translated from Izvestiya Akademii NAUK SSSR, Neorganicheskie Materialy, pp. 1516-1518 (Cited in CN OA issued Nov. 19, 2024).

* cited by examiner

*Primary Examiner* — Jane L Stanley

(74) *Attorney, Agent, or Firm* — Hunton Andrews Kurth LLP

(57) ABSTRACT

An oxide fluorescent material comprises: at least one first element $M^1$ selected from Li, Na, K, Rb, and Cs; at least one second element $M^2$ selected from Mg, Ca, Sr, Ba, and Zn; at least one third element $M^3$ selected from B, Al, Ga, In, and rare earth elements; at least one fourth element $M^4$ selected from Si, Ti, Ge, Zr, Sn, Hf, and Pb; O; and Cr, wherein when the molar ratio of the at least one fourth element $M^4$ in 1 mol of the composition is 5, the molar ratio of the at least one first element $M^1$ is 0.7 or more and 1.3 or less, the molar ratio of the at least one second element $M^2$ is 1.5 or more and 2.5 or less, the molar ratio of the at least one third element $M^3$ is 0.7 or more and 1.3 or less, the molar ratio of oxygen is 12.9 or more and 15.1 or less, and the molar ratio of Cr is more than 0 and 0.2 or less, and wherein the oxide fluorescent material has a light emission peak wavelength in a range of 700 nm or more and 1,050 nm or less in a light emission spectrum of the oxide fluorescent material.

9 Claims, 14 Drawing Sheets

OXIDE FLUORESCENT MATERIAL, LIGHT EMITTING DEVICE, AND METHOD FOR PRODUCING OXIDE FLUORESCENT MATERIAL

CROSS-REFERENCE TO RELATED PATENT APPLICATION

This application claims priority to Japanese Patent Application No. 2020-198326, filed on Nov. 30, 2020, and Japanese Patent Application No. 2021-178798, filed on Nov. 1, 2021, the disclosures of which are incorporated herein by references in their entirety.

BACKGROUND

Technical Field

The present disclosure relates to an oxide fluorescent material, a light emitting device, and a method for producing an oxide fluorescent material.

Description of Related Art

Light emitting devices having light emission intensity in a wavelength range from red light to near-infrared light are desired to be used in, for example, infrared cameras, infrared communications, light sources for plant growth and cultivation, vein authentication that is a type of biometric authentication, and food component analyzers that non-destructively measure the sugar content of food such as fruits and vegetables. Light emitting devices that emit light in the wavelength range from red light to near-infrared light as well as in a wavelength range of visible light are also desired.

Examples of such light emitting devices include a light emitting device that combines a light emitting diode (LED) and a fluorescent material.

Examples of the fluorescent material to be combined in the light emitting device include a fluorescent material having a relatively large light emission intensity of the light emission spectrum in the wavelength range from red light to near-infrared light (hereinafter, also referred to as "near-infrared light emitting fluorescent material"). In this specification, the "fluorescent material" is used in the same meaning as a "fluorescent phosphor".

As the near-infrared light emitting fluorescent material, Japanese Translation of PCT International Application Publication No. 2020-528486 discloses a fluorescent material having a light emission peak wavelength in a wavelength range of 680 nm or more and 760 nm or less and having a composition represented by, for example, $CaYAlO_4:Mn^{4+}$. Near-infrared light emitting fluorescent materials with a light emission spectrum in a wavelength range having a wide full width at half maximum and a longer light emission peak wavelength, which are suitable for each application described above, may be required.

The present disclosure has an object to provide an oxide fluorescent material having a light emission peak wavelength in a wavelength range from red light to near-infrared light and having a wider full width at half maximum of the light emission spectrum, a light emitting device using the same, and a method for producing an oxide fluorescent material.

SUMMARY

A first aspect of the present disclosure relates to an oxide fluorescent material having a composition containing: at least one first element $M^1$ selected from the group consisting of Li, Na, K, Rb, and Cs; at least one second element $M^2$ selected from the group consisting of Mg, Ca, Sr, Ba, and Zn; at least one third element $M^3$ selected from the group consisting of B, Al, Ga, In, and rare earth elements; at least one fourth element $M^4$ selected from the group consisting of Si, Ti, Ge, Zr, Sn, Hf, and Pb; O (oxygen); Cr; and optionally at least one fifth element $M^5$ selected from the group consisting of Eu, Ce, Tb, Pr, Nd, Sm, Yb, Ho, Er, Tm, Ni, and Mn, wherein when the molar ratio of the at least one fourth element $M^4$ in 1 mol of the composition of the oxide fluorescent material is 5, the molar ratio of the at least one first element $M^1$ is in a range of 0.7 or more and 1.3 or less, the molar ratio of the at least one second element $M^2$ is in a range of 1.5 or more and 2.5 or less, the molar ratio of the at least one third element $M^3$ is in a range of 0.7 or more and 1.3 or less, the molar ratio of O (oxygen) is in a range of 12.9 or more and 15.1 or less, and the molar ratio of Cr is more than 0 and 0.2 or less, and wherein the oxide fluorescent material has a light emission peak wavelength in a range of 700 nm or more and 1,050 nm or less in a light emission spectrum of the oxide fluorescent material.

A second aspect of the present disclosure relates to a light emitting device including the oxide fluorescent material and a light emitting element having a light emission peak wavelength in a range of 365 nm or more and 500 nm or less and irradiating the oxide fluorescent material.

A third aspect of the present disclosure relates to a method for producing an oxide fluorescent material including: preparing a first compound containing at least one first element $M^1$ selected from the group consisting of Li, Na, K, Rb, and Cs, a second compound containing at least one second element $M^2$ selected from the group consisting of Mg, Ca, Sr, Ba, and Zn, a third compound containing at least one third element $M^3$ selected from the group consisting of B, Al, Ga, In, and rare earth elements, a fourth compound containing at least one fourth element $M^4$ selected from the group consisting of Si, Ti, Ge, Zr, Sn, Hf, and Pb, a sixth compound containing Cr, and optionally a fifth compound containing at least one fifth element $M^5$ selected from the group consisting of Eu, Ce, Tb, Pr, Nd, Sm, Yb, Ho, Er, Tm, Ni, and Mn; adjusting and mixing the first compound, the second compound, the third compound, the fourth compound, the sixth compound, and optionally the fifth compound to prepare a raw material mixture such that, when the molar ratio of the at least one fourth element $M^4$ in 1 mol of the composition of the oxide fluorescent material is 5, the molar ratio of the at least one first element $M^1$ is in a range of 0.7 or more and 1.3 or less, the molar ratio of the at least one second element $M^2$ is in a range of 1.5 or more and 2.5 or less, the molar ratio of the at least one third element $M^3$ is in a range of 0.7 or more and 1.3 or less, and the molar ratio of Cr is more than 0 and 0.2 or less; and heat-treating the raw material mixture at a temperature in a range of 1,000° C. or higher and 1,500° C. or lower in an atmosphere containing oxygen to obtain an oxide fluorescent material, wherein at least one selected from the group consisting of the first compound, the second compound, the third compound, the fourth compound, and the sixth compound is an oxide.

The present disclosure is capable of providing an oxide fluorescent material having a light emission peak wavelength in a wavelength range from red light to near-infrared light and having a wider full width at half maximum of the light emission spectrum, a light emitting device using the same, and a method for producing an oxide fluorescent material.

DETAILED DESCRIPTION

Figure 1:
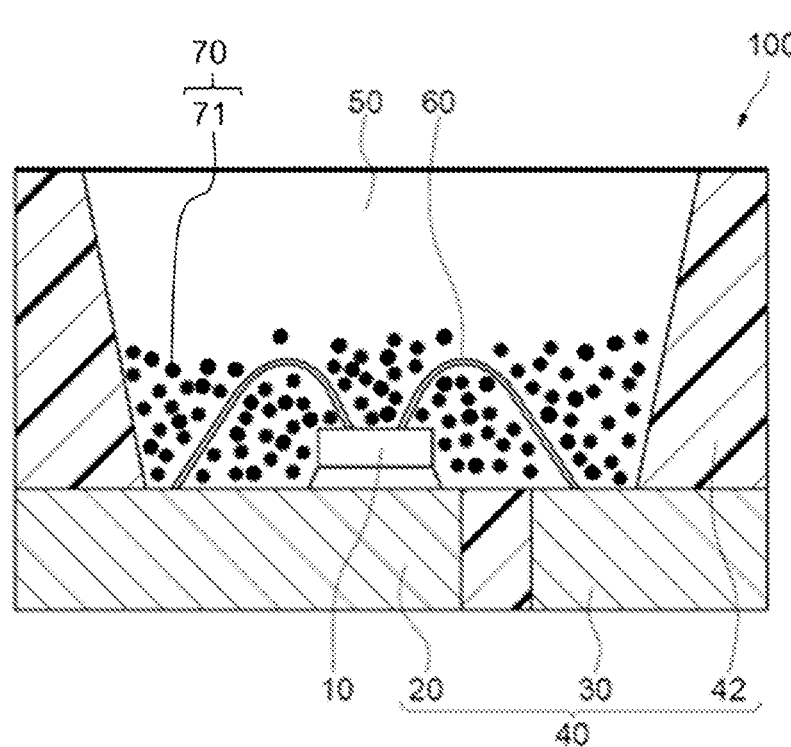
FIG. 1 is a schematic cross-sectional view showing an exemplary light emitting device according to a first embodiment of the present disclosure.

The oxide fluorescent material, the light emitting device using the same, and the method for producing an oxide fluorescent material according to the present disclosure will be hereunder described. The embodiments described below are intended to embody the technical idea of the present disclosure, and the present disclosure is not limited to the following oxide fluorescent material, the light emitting device, and the method for producing an oxide fluorescent material. The relationship between color names and chromaticity coordinates, and the relationship between wavelength ranges of light and color names of monochromic light are in accordance with Japanese Industrial Standard (JIS) Z8110.

Light emitting devices using a fluorescent material are required to emit light in an appropriate wavelength range according to a visual object and usage conditions. For example, the medical field may require easily obtaining information in a living body. The living body includes, for example, water, hemoglobin, and melanin as light absorbers. For example, hemoglobin has a high light absorptance in a visible light wavelength range of less than 650 nm, and with a light emitting device that emits light in the visible light wavelength range, it is difficult for light in the visible light wavelength range to transmit through the living body, which makes difficult to obtain information in the living body. There is called a "living body window" where light easily transmits through the living body. A light emitting device that emits light in a near-infrared light wavelength range of 650 nm or more and 1,050 nm or less, for example, including at least one part of that the wavelength range of called a "living body window", may be required. For example, when the increase or decrease in oxygen concentration in the blood in the living body can be measured by the increase or decrease in light absorption owing to hemoglobin that binds to oxygen, the information in the living body can be easily obtained by irradiating light emitted from the light emitting device. Therefore, the fluorescent material used in the light emitting device may be required to have a light emission peak wavelength in the wavelength range of 650 nm or more and 1,050 nm or less.

For example, the food field requires non-destructive sugar content meters for measuring the sugar content of fruits and vegetables in a non-destructive manner, and non-destructive taste meters for rice. Near-infrared spectroscopy may be used as a non-destructive method for measuring internal quality such as sugar content, acidity, ripeness, and internal damage of fruits and vegetables, and surface quality appearing on the skin surface of fruits and vegetables or in the surface layer near the skin surface, such as abnormal drying. In the near-infrared spectroscopy, fruits and vegetables are irradiated with light in the near-infrared light wavelength range, and the transmitted light that is transmitted through the fruits and vegetables and the reflected light that is reflected by the fruits and vegetables are received to measure the quality of the fruits and vegetables by the decrease in light intensity (light absorption). A light source such as tungsten lamp or xenon lamp is used in a near-infrared spectroscopy analysis device used in the food filed. In the present specification, the wavelength range of red light is in accordance with JIS Z8110.

It is also desirable to stably supply plants such as vegetables and to increase the production efficiency of plants in the face of environmental changes such as climate change. Plant factories that can be artificially controlled can stably supply safe vegetables to the market and are expected as a next-generation industry. Such plant factories require a light emitting device that emits light capable of promoting the growth of plants. Reaction of plants to light can be grouped into photosynthesis and photomorphogenesis. Photosynthesis is a reaction that uses light energy to decompose water, generates oxygen, and fixes carbon dioxide to organic materials, which is a necessary reaction for the growth of plants. Photomorphogenesis is a morphogenetic reaction that uses light as a signal for seed germination, differentiation (germination formation, leaf formation), movement (pore opening and closing, chloroplast movement), and photorefraction. In the photomorphogenesis reaction, it has been found that light in the wavelength range of 690 nm or more and 800 nm or less affects the photoreceptors of plants. Therefore, light emitting devices used in plant factories may be required to be capable of irradiating light in the wavelength range that affects plant photoreceptors (chlorophyll a, chlorophyll b, carotenoids, phytochromes, cryptochromes, and phototropins) and promotes the growth of plants.

As for the above-mentioned near-infrared light emitting fluorescent material, when a light emitting element such as a blue light emitting diode (LED) or laser diode (LD) that emits light from purple to blue is used as an excitation light source in the light emitting device, there is also room to improve the light emission characteristics of the fluorescent material so as to be able to emit light suitable for the intended use.

Light emitting devices that emit light in the near-infrared light wavelength range of 700 nm or more and 1,050 nm or less as well as in the wavelength range of 365 nm or more and less than 700 nm may be required. For example, it may be necessary to emit light in the visible light wavelength range not only to obtain internal information on living bodies and fruits and vegetables, but also to enhance the visibility of objects. For example, a reflection spectroscopic measuring device used for measuring film thickness may require a light emitting device that emits light with a light emission intensity of 10% or more relative to the maximum light emission intensity in the light emission spectrum over a wide wavelength range including a part of the visible light wavelength range of 365 nm or more and less than 700 nm to the near-infrared light wavelength range of 700 nm or more and 1,050 nm or less.

Oxide Fluorescent Material

The oxide fluorescent material according to an exemplary embodiment of the present disclosure has a composition containing: at least one first element $M^1$ selected from the group consisting of Li, Na, K, Rb, and Cs; at least one second element $M^2$ selected from the group consisting of Mg, Ca, Sr, Ba, and Zn; at least one third element $M^3$ selected from the group consisting of B, Al, Ga, In, and rare earth elements; at least one fourth element $M^4$ selected from the group consisting of Si, Ti, Ge, Zr, Sn, Hf, and Pb; O (oxygen); Cr; and optionally at least one fifth element $M^5$ selected from the group consisting of Eu, Ce, Tb, Pr, Nd, Sm, Yb, Ho, Er, Tm, Ni, and Mn, wherein when the molar ratio of the fourth element $M^4$ in 1 mol of the composition of the oxide fluorescent material is 5, the molar ratio of the first element $M^1$ is in a range of 0.7 or more and 1.3 or less, the molar ratio of the second element $M^2$ is in a range of 1.5 or more and 2.5 or less, the molar ratio of the third element $M^3$ is in a range of 0.7 or more and 1.3 or less, the molar ratio of O (oxygen) is in a range of 12.9 or more and 15.1 or less, and the molar ratio of Cr is more than 0 and 0.2 or less, and wherein the oxide fluorescent material has a light emission peak wavelength in a range of 700 nm or more and 1,050 nm or less in the light emission spectrum of the fluorescent material. The oxide fluorescent material can absorb excitation light and emit light having a light emission peak wavelength in a range of 700 nm or more and 1,050 nm or less, which enables measurement of internal information on living bodies and foods such as fruits and vegetables. In the present specification, the "molar ratio" represents the ratio of each element in 1 mol of the chemical composition of the fluorescent material, unless otherwise specified.

The oxide fluorescent material preferably has a composition including a composition formula represented by the following formula (1):

$$M^1_t M^2_u M^3_v M^4_5 O_w : Cr_x, M^5_y \qquad (1)$$

wherein t, u, v, w, x, and y each satisfy $0.7 \leq t \leq 1.3$, $1.5 \leq u \leq 2.5$, $0.7 \leq v \leq 1.3$, $12.9 \leq w \leq 15.1$, $0 < x \leq 0.2$, $0 \leq y \leq 0.10$, and $y < x$.

In the oxide fluorescent material, the first element $M^1$ is at least one element selected from the group consisting of Li, Na, K, and Rb, the second element $M^2$ is at least one element selected from the group consisting of Mg, Ca, and Sr, the third element $M^3$ is at least one element selected from the group consisting of Sc, Al, Ga, and In, the fourth element $M^4$ contains Ge as a mandatory element and may contain at least one element selected from the group consisting of Si, Ti, Zr, Sn, Hf, and Pb, and the fifth element $M^5$ may be at least one element selected from the group consisting of Yb, Nd, Tm, and Er.

The molar ratio of the first element $M^1$ is in a range of 0.7 or more and 1.3 or less, may be in a range of 0.8 or more and 1.2 or less, and may be in a range of 0.9 or more and 1.1 or less, when the molar ratio of the fourth element $M^4$ is 5 in 1 mol of the composition of the oxide fluorescent material. When the oxide fluorescent material has the composition represented by the formula (1), the parameter t, which represents the molar ratio of the first element $M^1$, satisfies $0.7 \leq t \leq 1.3$, may satisfy $0.8 \leq t \leq 1.2$, and may satisfy $0.9 \leq t \leq 1.1$, in 1 mol of the composition of the oxide fluorescent material.

The molar ratio of the second element $M^2$ is in a range of 1.5 or more and 2.5 or less, may be in a range of 1.7 or more and 2.3 or less, may be in a range of 1.8 or more and 2.2 or less, and may be 2, when the molar ratio of the fourth element $M^4$ is 5 in 1 mol of the composition of the oxide fluorescent material. When the oxide fluorescent material has the composition represented by the formula (1), the parameter u, which represents the molar ratio of the second element $M^2$, satisfies $1.5 \leq u \leq 2.5$, may satisfy $1.7 \leq u \leq 2.3$, may satisfy $1.8 \leq u \leq 2.2$, and may satisfy u=2, in 1 mol of the composition of the oxide fluorescent material.

The third element $M^3$ is at least one selected from the group consisting of B, Al, Ga, In, and rare earth elements. The rare earth elements include Sc, Y, La, Ce, Pr, Nd, Sm, Eu, Gd, Tb, Dy, Ho, Er, Tm, Yb, and Lu. The third element $M^3$ is preferably at least one selected from the group consisting of B, Al, Ga, In, Sc, Y, La, Gd, and Lu, and is more preferably at least one selected from the group consisting of Sc, Al, Ga, and In. When the third element $M^3$ is a rare earth element and the fifth element $M^5$ is containing the oxide fluorescent material, the third element $M^3$ is preferably not the same rare earth element as the fifth element $M^5$.

The molar ratio of the third element $M^3$ is in a range of 0.7 or more and 1.3 or less, may be in a range of 0.8 or more and 1.2 or less, and may be in a range of 0.9 or more and 1.1 or less, when the molar ratio of the fourth element $M^4$ is 5 in 1 mol of the composition of the oxide fluorescent material. When the oxide fluorescent material has the composition represented by the formula (1), the parameter v, which represents the molar ratio of the third element $M^3$, satisfies $0.7 \leq v \leq 1.3$, may satisfy $0.8 \leq v \leq 1.2$, and may satisfy $0.9 \leq v \leq 1.1$, in 1 mol of the composition of the oxide fluorescent material.

The fourth element $M^4$ is at least one selected from the group consisting of Si, Ti, Ge, Zr, Sn, Hf, and Pb, and may contain two or more thereof. The fourth element $M^4$ contains Ge as a mandatory element and may contain at least one element selected from the group consisting of Si, Ti, Zr, Sn, Hf, and Pb. The fourth element $M^4$ may be Ge. When the fourth element $M^4$ mandatorily contains Ge and contains at least one selected from the group consisting of Si, Ti, Zr, Sn, Hf, and Pb, the molar ratio of Ge is preferably larger than that of $M^4$, and when the total molar ratio of Ge and $M^4$ is 5, it is preferable that the molar ratio of Ge is 3 to 4 and the molar ratio of $M^4$ is 1 to 2.

The molar ratio of O (oxygen) contained in the oxide fluorescent material is in a range of 12.9 or more and 15.1 or less, may be in a range of 13 or more and 15 or less, may be in a range of 13.5 or more and 14.5 or less, and may be 14, when the molar ratio of the fourth element $M^4$ is 5 in 1 mol of the composition of the oxide fluorescent material. When the oxide fluorescent material has the composition represented by the formula (1), the parameter w, which represents the molar ratio of O (oxygen), satisfies $12.9 \leq w \leq 15.1$, may satisfy $13.0 \leq w \leq 15.0$, may satisfy $13.5 \leq w \leq 14.5$, and may satisfy w=14, in 1 mol of the composition of the oxide fluorescent material.

Cr contained in the oxide fluorescent material is an activating element of the oxide fluorescent material. The molar ratio of Cr contained in the oxide fluorescent material is more than 0 and 0.2 or less when the molar ratio of the fourth element $M^4$ is 5 in 1 mol of the composition of the oxide fluorescent material. In order to emit light from the oxide fluorescent material by being irradiated with light from an excitation light source such as a light emitting element, the molar ratio of Cr contained in the oxide fluorescent material is a value more than 0, may be in a range of more than 0 and 0.2 or less, may be in a range of 0.001 or more and 0.2 or less, may be in a range of 0.002 or more and 0.18 or less, and may be in a range of 0.003 or more and 0.15 or less. When the oxide fluorescent material has the composition represented by the above-mentioned formula (1), the parameter x, which represents the molar ratio of Cr, satisfies $0 < x \leq 0.2$, may satisfy $0.001 \leq x \leq 0.2$, may satisfy $0.002 \leq x \leq 0.18$, and may satisfy $0.003 \leq x \leq 0.15$, in 1 mol of the composition of the oxide fluorescent material.

The fifth element $M^5$ optionally contained in the oxide fluorescent material is an activating element together with Cr; and may be at least one element selected from the group consisting of Eu, Ce, Tb, Pr, Nd, Sm, Yb, Ho, Er, Tm, Ni, and Mn, and may be at least one element selected from the group consisting of Yb, Nd, Tm, and Er.

As for the molar ratio of the fifth element $M^5$ optionally contained in the oxide fluorescent material, when the molar ratio of the fourth element $M^4$ is 5 in 1 mol of the composition of the oxide fluorescent material, the total molar ratio of Cr and the fifth element $M^5$ is preferably 0.2 or less, may be in a range of 0 or more and 0.10 or less, may be in a range of 0.001 or more and 0.09 or less, and may be in a range of 0.002 or more and 0.08 or less. The molar ratio of the fifth element $M^5$ is preferably smaller than that of Cr. When the oxide fluorescent material has the composition represented by the above-mentioned formula (1), the parameter y, which represents the molar ratio of the fifth element $M^5$, satisfies $0 \leq y \leq 0.10$, may satisfy $0.001 \leq y \leq 0.10$, may satisfy $0.001 \leq y \leq 0.09$, and may satisfy $0.002 \leq y \leq 0.08$, in 1 mol of the composition of the oxide fluorescent material. When the oxide fluorescent material has the composition represented by the above-mentioned formula (1), the parameter x representing the molar ratio of Cr and the parameter y representing the molar ratio of the fifth element $M^5$ preferably satisfy $y < x$ and $0 < x+y \leq 0.2$, in 1 mol of the composition of the oxide fluorescent material.

The oxide fluorescent material has a light emission peak wavelength in a range of 700 nm or more and 1,050 nm or less, and the full width at half maximum of the light emission spectrum having the light emission peak wavelength is preferably 100 nm or more. In the light emission spectrum of the oxide fluorescent material, the full width at half maximum of the light emission spectrum having the light emission peak wavelength is preferably 110 nm or more, and more preferably 120 nm or more. The oxide fluorescent material preferably has a wider full width at half maximum of the light emission spectrum. The full width at half maximum of the light emission spectrum having the light emission peak wavelength may be 400 nm or less, may be 350 nm or less, and may be 300 nm or less. In the present specification, the full width at half maximum refers to a wavelength width that is the light emission intensity is 50% of the light emission intensity at the light emission peak wavelength showing the maximum light emission intensity in the light emission spectrum. Light is absorbed and scattered in a living body, and in order to measure a subtle change in propagation behavior of light in the blood in the living body, it is preferable to irradiate light having a light emission peak with a wide full width at half maximum. In the case of measuring foods such as fruits and vegetables in a non-destructive manner, it is also preferable to irradiate light having a light emission peak with a wide full width at half maximum in order to obtain information on the inside of foods. In order to obtain information in a living body and information inside foods in a non-destructive manner, it is preferable that the full width at half maximum of the light emission peak having the light emission peak wavelength of the oxide fluorescent material is wide. It is also desirable for the color appearance of an object when irradiated with light (hereinafter, also referred to as "color rendering property") to have a light emission spectrum in a wide wavelength range, and the wider the full width at half maximum, the better the color rendering property of light can be emitted. For example, in the case of emitting light in a wavelength range that affects plant growth in a plant factory, it may be required to emit light that does not disturb the spectral balance of the light for workers to easily work.

It is preferable that the oxide fluorescent material has a monoclinic crystal structure and the space group belongs to P321. When the oxide fluorescent material has the above-mentioned composition and belongs to the monoclinic space group P321, light emission having a light emission peak wavelength in a range of 700 nm or more and 1,050 nm or less can be efficiently obtained by light irradiated from the light emitting element.

Light Emitting Device

The light emitting device includes an oxide fluorescent material and a light emitting element that irradiates the oxide fluorescent material. The oxide fluorescent material can be used as a member constituting a wavelength conversion member together with a translucent material.

The light emitting device preferably includes, for example, an LED chip or an LD chip using a nitride-based semiconductor as the light emitting element that irradiates the oxide fluorescent material.

The light emitting element preferably has a light emission peak wavelength in a range of 360 nm or more and 700 nm or less, more preferably in a range of 365 nm or more and 600 nm or less, and even more preferably in a range of 365 nm or more and 500 nm or less. By using the light emitting element as the excitation light source of the oxide fluorescent material, a light emitting device that emits mixed color light of light emitted from the light emitting element and fluorescence emitted from the fluorescent material containing the oxide fluorescent material in a desired wavelength range can be constituted. The full width at half maximum of the light emission peak in the light emission spectrum of the light emitting device can be, for example, 30 nm or less. As the light emitting element, for example, it is preferable to use a light emitting element using a nitride-based semiconductor. By using a light emitting device using a nitride-based semiconductor as the excitation light source, a stable light emitting device having high efficiency, high output linearity with respect to input, and high resistance to mechanical impacts can be obtained.

The light emitting device mandatorily includes a first fluorescent material containing the above-mentioned oxide fluorescent material, and may further include a different fluorescent material. The light emitting device preferably includes, in addition to the first fluorescent material, at least one fluorescent material selected from the group consisting of a second fluorescent material having a light emission peak wavelength in a range of 455 nm or more and less than 495 nm, a third fluorescent material having a light emission peak wavelength in a range of 495 nm or more and less than 610 nm, a fourth fluorescent material having a light emission peak wavelength in a range of 610 nm or more and less than 700 nm, and a fifth fluorescent material having a light emission peak wavelength in a range of 700 nm or more and 1,050 nm or less, in the light emission spectrum of each fluorescent material. The light emitting device preferably has a light emission spectrum that is continuous in a range of the light emission peak wavelength of the light emitting element or more and 1,050 nm or less, in which when the maximum value of the light emission intensity in the range of the light emission peak wavelength of the light emitting element or more and 1,050 nm or less is 100%, the minimum value of the light emission intensity in the range of the light emission peak wavelength of the light emitting element or more and 1,050 nm or less is 10% or more. The light emission spectrum of the light emitting device is continuous in the range of the light emission peak wavelength of the light emitting device or more and 1,050 nm or less means that the light emission intensity of the light emission spectrum does not become 0% and the light emission spectrum is continuous without interruption within the entire wavelength range of the light emission peak wavelength of the light emitting device or more and 1,050 nm or less. Depending on the measurement target or detection target such as in a living body or fruits and vegetables, a light source that emits light having a continuous light emission spectrum in a wavelength range including visible light to a part of near-infrared light may be required. In the case of using a tungsten lamp or a xenon lamp as the light source, light having a continuous light emission spectrum may be emitted without interrupting the light emission spectrum in the wavelength range including visible light to a part of near-infrared light. However, when using a tungsten lamp or a xenon lamp as the light source, it may be difficult to miniaturize the device. The light emitting device capable of emitting light having a light emission spectrum that is continuous in a range of the light emission peak wavelength of the light emitting element or more and 1,050 nm or less, in which when the maximum value of the light emission intensity in the range of the light emission peak wavelength of the light emitting element or more and 1,050 nm or less is 100%, the minimum value of the light emission intensity in the range of the light emission peak wavelength of the light emitting element or more and 1,050 nm or less is 10% or more, can be downsized compared to a light emitting device using a tungsten lamp or a xenon lamp as the light source. A small light emitting device can be mounted on a small mobile device such as a smartphone to obtain information in a living body, which can be used to manage physical conditions. Here, the term "within the range of the light emission peak wavelength of the light emitting element or more and 1,050 nm or less" means, for example, within the range of 420 nm or more and 1,050 nm or less when the light emission peak wavelength of the light emitting element is 420 nm.

The light emitting device has a light emission spectrum that is continuous in a range of the light emission peak wavelength of the light emitting element or more and 1,050 nm or less, in which when the maximum value of the light emission intensity in the range of the light emission peak wavelength of the light emitting element or more and 1,050 nm or less is 100%, the minimum value of the light emission intensity in the range of the light emission peak wavelength of the light emitting element or more and 1,050 nm or less may be 15% or more, may be 20% or more, may be 25% or more; and may be 100% or less, may be 80% or less, may be 70% or less, and may be 60% or less. For example, when the light emission peak wavelength of the light emitting element is 420 nm or more, the range of the light emission peak wavelength of the light emitting element or more and 1,050 nm or less means the range of 420 nm or more and 1,050 nm or less. For example, when the light emission peak wavelength of the light emission spectrum of the light emitting element is 450 nm or more, the range of the light emission peak wavelength of the light emitting element or more and 1,050 nm or less means the range of 450 nm or more and 1,050 nm or less.

The light emitting device has a light emission spectrum that is continuous in a range of the light emission peak wavelength of the light emitting element or more and 1,050 nm or less, in which when the maximum value of the light emission intensity in the range of the light emission peak wavelength of the light emitting element or more and 1,050 nm or less is 100%, the minimum value of the light emission intensity in the range of the light emission peak wavelength of the light emitting element or more and 1,050 nm or less is 10% or more, thereby emitting light in a wide wavelength range from visible light to near-infrared light. Such a light emitting device can be used, for example, in a reflection spectroscopic measuring device, and a lighting device capable of non-destructively measuring a living body, fruits and vegetables, and the like and requiring light excellent in color rendering property.

The second fluorescent material, which has a composition different from that of the first fluorescent material containing the above-mentioned oxide fluorescent material, preferably contains at least one fluorescent material selected from the group consisting of a phosphate fluorescent material having a composition included in a composition formula represented by the following formula (2a), an aluminate fluorescent material having a composition included in a composition formula represented by the following formula (2b), and an aluminate fluorescent material having a composition included in a composition formula represented by the following formula (2c); and may contain two or more fluorescent materials of these.

$$(Ca,Sr,Ba,Mg)_{10}(PO_4)_6(F,Cl,Br,I)_2:Eu \qquad (2a)$$

$$(Ba,Sr,Ca)MgAl_{10}O_{17}:Eu \qquad (2b)$$

$$Sr_4Al_{14}O_{25}:Eu \qquad (2c)$$

In the present specification, plural elements sectioned by comma (,) in the composition formulae mean that at least one of these plural elements is contained in the composition. In the present specification, in the composition formulae representing the compositions of the fluorescent materials, the part before the colon (:) represents elements and the molar ratio constituting a host crystal, and the part after the colon (:) represents an activating element.

The third fluorescent material preferably contains at least one fluorescent material selected from the group consisting of a silicate fluorescent material having a composition included in a composition formula represented by the following formula (3a), an aluminate fluorescent material or a gallate fluorescent material having a composition included in a composition formula represented by the following formula (3b), a ß-SiAlON fluorescent material having a composition included in a composition formula represented by the following formula (3c), a cesium lead halide fluorescent material having a composition included in a composition formula represented by the following formula (3d), and a nitride fluorescent material having a composition included in a composition formula represented by the following formula (3e); and may contain two or more fluorescent materials of these. In the case where the third fluorescent material contains two or more fluorescent materials, each of the two or more fluorescent materials preferably has a light emission peak wavelength in a different range within a range of 495 nm or more and less than 610 nm.

$$(Ca,Sr,Ba)_8MgSi_4O_{16}(F,Cl,Br)_2:Eu \tag{3a}$$

$$(Lu,Y,Gd,Tb)_3(Al,Ga)_5O_{12}:Ce \tag{3b}$$

$$Si_{6-z}Al_zO_zN_{8-z}:Eu(0<z\leq4.2) \tag{3c}$$

$$CsPb(F,Cl,Br)_3 \tag{3d}$$

$$(La,Y,Gd)_3Si_6N_{11}:Ce \tag{3e}$$

The fourth fluorescent material preferably contains at least one fluorescent material selected from the group consisting of a nitride fluorescent material having a composition included in a composition formula represented by the following formula (4a), a fluoro-germanate fluorescent material having a composition included in a composition formula represented by the following formula (4b), an oxynitride fluorescent material having a composition included in a composition formula represented by the following formula (4c), a fluoride fluorescent material having a composition included in a composition formula represented by the following formula (4d), a fluoride fluorescent material having a composition included in a composition formula represented by the following formula (4e), a nitride fluorescent material having a composition included in a composition formula represented by the following formula (4f), and a nitride fluorescent material having a composition included in a composition formula represented by the following formula (4g); and may contain two or more fluorescent materials of these. In the case where the fourth fluorescent material contains two or more fluorescent materials, each of the two or more fluorescent materials preferably has a light emission peak wavelength in a different range within a range of 610 nm or more and less than 700 nm.

$$(Sr,Ca)AlSiN_3:Eu \tag{4a}$$

$$3.5MgO\cdot0.5MgF_2\cdot GeO_2:Mn \tag{4b}$$

$$(Ca,Sr,Mg)_kSi_{12-(m+n)}Al_{m+n}O_nN_{16-n}:Eu \tag{4c}$$

wherein k, m, and n each satisfy $0<k\leq2.0$, $2.0\leq m\leq6.0$, and $0\leq n\leq2.0$.

$$A_c[M^6{}_{1-b}Mn^{4+}{}_bF_d] \tag{4d}$$

wherein A includes at least one selected from the group consisting of $K^+$, $Li^+$, $Na^+$, $Rb^+$, $Cs^+$, and $NH_4{}^+$, of which $K^+$ is preferred; $M^6$ includes at least one element selected from the group consisting of Group 4 elements and Group 14 elements, of which Si and Ge are preferred; b satisfies $0<b<0.2$; c represents the absolute value of the charge of $[M^6{}_{1-b}Mn^{4+}{}_bF_d]$ ions; and d satisfies $5<d<7$.

$$A'_{c'}[M^{6'}{}_{1-b'}Mn^{4+}{}_{b'}F_{d'}] \tag{4e}$$

wherein A' includes at least one selected from the group consisting of $K^+$, $Li^+$, $Na^+$, $Rb^+$, $Cs^+$, and $NH_4{}^+$, of which $K^+$ is preferred; $M^{6'}$ includes at least one element selected from the group consisting of Group 4 elements, Group 13 elements, and Group 14 elements, of which Si and Al are preferred; b' satisfies $0<b'<0.2$; c' represents the absolute value of the charge of $[M^{6'}{}_{1-b'}Mn^{4+}{}_{b'}F_{d'}]$ ions; and d' satisfies $5<d'<7$.

$$(Ba,Sr,Ca)_2Si_5N_8:Eu \tag{4f}$$

$$(Sr,Ca)LiAl_3N_4:Eu \tag{4g}$$

The fifth fluorescent material preferably contains at least one fluorescent material selected from the group consisting of a gallate fluorescent material having a composition represented by the following formula (5a), an aluminate fluorescent material having a composition represented by the following formula (5b), a gallate fluorescent material having a composition represented by the following formula (5c), and an aluminate fluorescent material having a composition included in a composition formula represented by the following formula (5d); and may contain two or more fluorescent materials of these. By including the fifth fluorescent material together with the first fluorescent material containing the oxide fluorescent material of an exemplary embodiment, the light emitting device can emit light having a light emission spectrum that is continuous not only in the near-infrared light wavelength range of 700 nm or more and 1,050 nm or less, but also in the range of the light emission peak wavelength of the light emitting element or more and 1,050 nm or less, in which when the maximum value of the light emission intensity in the range of the light emission peak wavelength of the light emitting element or more and 1,050 nm or less is 100%, the minimum value of the light emission intensity in the range of the light emission peak wavelength of the light emitting element or more and 1,050 nm or less is 10% or more.

$$Ga_2O_3:Cr \tag{5a}$$

$$Al_2O_3:Cr \tag{5b}$$

$$ZnGa_2O_4:Cr \tag{5c}$$

$$(Lu,Y,Gd,Tb)_3(Al,Ga)_5O_{12}:Ce,Cr \tag{5d}$$

Figure 2:
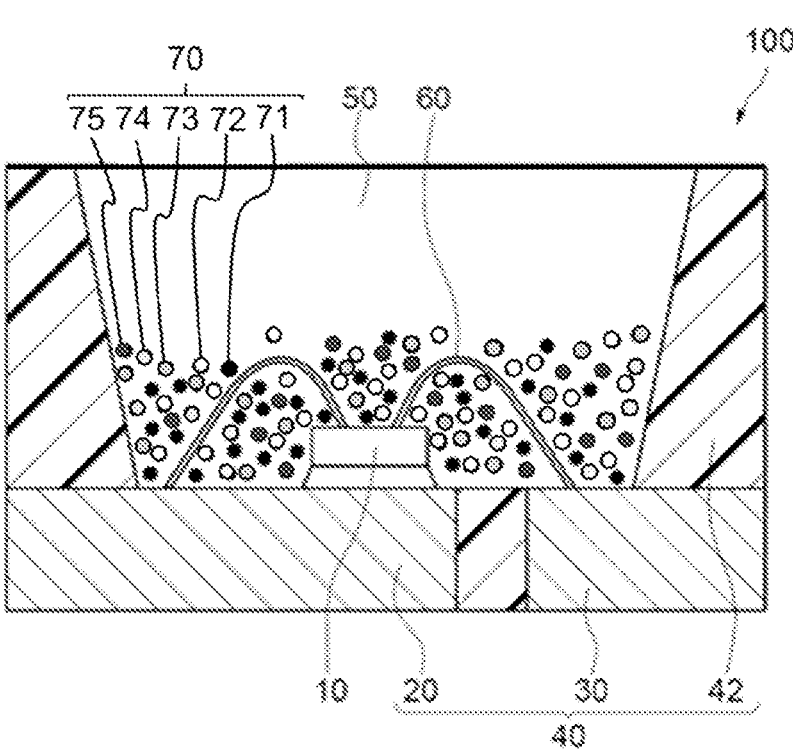
FIG. 2 is a schematic cross-sectional view showing another exemplary light emitting device according to the first embodiment of the present disclosure.

An example of the light emitting device will be described with reference to the drawings. FIG. 1 is a schematic cross-sectional view showing an exemplary light emitting device according to a first embodiment of the present disclosure. FIG. 2 is a schematic cross-sectional view showing another exemplary light emitting device according to the first embodiment of the present disclosure.

As shown in FIG. 1, a light emitting device 100 is provided with a molded body 40 having a recessed portion, a light emitting element 10 serving as an excitation light source, and a wavelength conversion member 50 that covers the light emitting element 10. The molded body 40 is formed by integrally molding a first lead 20, a second lead 30, and a resin portion 42 containing a thermoplastic resin or a thermosetting resin. In the molded body 40, the first lead 20 and the second lead 30 constituting the bottom surface of the recessed portion are arranged, and the resin portion 42 constituting the side surfaces of the recessed portion is arranged. The light emitting element 10 is mounted on the bottom surface of the recessed portion of the molded body 40. The light emitting element 10 has a pair of positive and negative electrodes, and the pair of positive and negative electrodes each are electrically connected to the first lead 20 and the second lead 30 via wires 60. The light emitting element 10 is covered by the wavelength conversion member 50. The wavelength conversion member 50 includes a fluorescent material 70 that converts the wavelength of the light emitting element 10 and a translucent material. The fluorescent material 70 mandatorily may contain a first fluorescent material 71 containing the oxide fluorescent material of an exemplary embodiment. The fluorescent material 70 may contain a fluorescent material having a light emission peak wavelength in a wavelength range different from that of the first fluorescent material 71. As shown in FIG. 2, the fluorescent material 70 preferably contains at least one fluorescent material selected from the group consisting of the second fluorescent material 72, the third fluorescent material 73, the fourth fluorescent material 74, and the fifth fluorescent material 75 described above, and may contain two or more types of these. The fluorescent material 70 mandatorily contains the first fluorescent material 71, and may contain the second fluorescent material 72, the third fluorescent material 73, the fourth fluorescent material 74, and the fifth fluorescent material 75. The wavelength conversion member 50 also functions as a member for protecting the light emitting element 10 and the fluorescent material 70 from the external environment. The light emitting device 100 emits light upon receiving external electric power via the first lead 20 and the second lead 30.

Figure 3A:
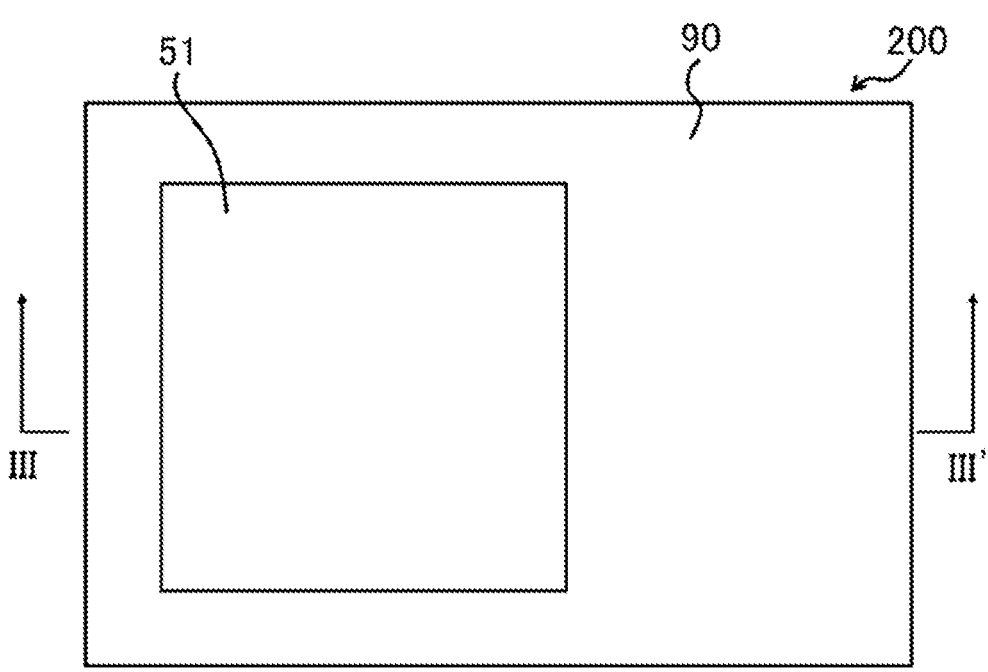
FIG. 3A is a schematic plan view showing an exemplary light emitting device according to a second embodiment of the present disclosure.
Figure 3B:
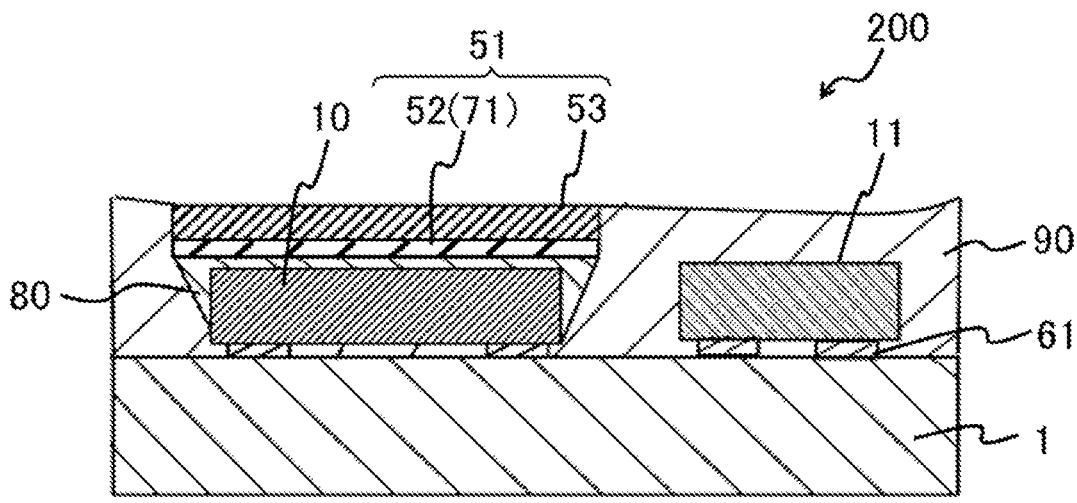
FIG. 3B is a schematic cross-sectional view showing an exemplary light emitting device according to a second embodiment of the present disclosure.

FIGS. 3A and 3B show an exemplary light emitting device according to a second embodiment of the present disclosure. FIG. 3A is a schematic plan view of a light emitting device 200. FIG. 3B is a schematic cross-sectional view of the III-III' line of the light emitting device 200 shown in FIG. 3A. The light emitting device 200 includes a light emitting element 10 having a light emission peak wavelength in a range of 365 nm or more and 500 nm or less, and a wavelength conversion member 51 including a wavelength conversion body 52 containing a first fluorescent material 71 that is excited by light emitted from the light emitting element 10 and emits light, and a translucent body 53 on which the wavelength conversion body 52 is arranged. The light emitting element 10 is flip-chip mounted on a substrate 1 via bumps that are conductive members 61. The wavelength conversion body 52 of the wavelength conversion member 51 is arranged on the light emitting surface of the light emitting element 10 via an adhesive layer 80. The side surfaces of the light emitting element 10 and the wavelength conversion member 52 are covered with a covering member 90 that reflects light. The wavelength conversion body 52 is excited by light emitted from the light emitting element 10 and mandatorily contains the first fluorescent material 71 containing an oxide fluorescent material. The wavelength conversion body 52 may contain at least one selected from the group consisting of the second fluorescent material, the third fluorescent material, the fourth fluorescent material, and the fifth fluorescent material. The light emitting element 10 is capable of receiving electric power from the outside of the light emitting device 200 via the wiring and the conductive members 61 formed on the substrate 1, thereby allowing the light emitting device 200 to emit light. The light emitting device 200 may include a semiconductor element 11 such as a protective element for preventing the light emitting element 10 from being destroyed due to excessive voltage application. The covering member 90 is provided so as to cover, for example, the semiconductor element 11. Each member used in the light emitting device will be hereunder described. For the details, for example, the disclosure of Japanese Unexamined Patent Publication No. 2014-112635 may be referred to.

Examples of the translucent material constituting the wavelength conversion member together with the fluorescent material include at least one selected from the group consisting of resin, glass, and inorganic substances. The resin can use at least one resin selected from the group consisting of a silicone resin, an epoxy resin, a phenol resin, a polycarbonate resin, an acrylic resin, and modified resins thereof. Among others, a silicone resin and a modified silicone resin are preferred since they are excellent in heat resistance and light resistance. The wavelength conversion member may optionally include a filler, a colorant, and a light diffusing material in addition to the fluorescent material and the translucent material. Examples of the filler include silicon oxide, barium titanate, titanium oxide, and aluminum oxide.

When the wavelength conversion member includes a resin and a fluorescent material, it is preferable to form a wavelength conversion member-forming composition that includes the fluorescent material in the resin, and then form a wavelength conversion member using the wavelength conversion member-forming composition. In the wavelength conversion member-forming composition, the content of the first fluorescent material containing the oxide fluorescent material is preferably in a range of 30 parts by mass or more and 100 parts by mass or less, may be in a range of 40 parts by mass or more and 90 parts by mass or less, and may be in a range of 45 parts by mass or more and 85 parts by mass or less, relative to 100 parts by mass of the resin. The first fluorescent material may contain only the oxide fluorescent material of an exemplary embodiment. The oxide fluorescent material contained in the first fluorescent material may contain two or more types of oxide fluorescent materials having different compositions.

The content of each fluorescent material in the wavelength conversion member-forming composition is within the range described below.

The content of the second fluorescent material contained in the wavelength conversion member-forming composition may be in a range of 10 parts by mass or more and 100 parts by mass or less, may be in a range of 20 parts by mass or more and 90 parts by mass or less, and may be in a range of 30 parts by mass or more and 80 parts by mass or less, relative to 100 parts by mass of the resin.

The content of the third fluorescent material contained in the wavelength conversion member-forming composition may be in a range of 5 parts by mass or more and 100 parts by mass or less, may be in a range of 10 parts by mass or more and 90 parts by mass or less, may be in a range of 15 parts by mass or more and 80 parts by mass or less, may be in a range of 20 parts by mass or more and 70 parts by mass or less, and may be in a range of 25 parts by mass or more and 60 parts by mass or less, relative to 100 parts by mass of the resin.

The content of the fourth fluorescent material contained in the wavelength conversion member-forming composition may be in a range of 1 part by mass or more and 50 parts by mass or less, may be in a range of 2 parts by mass or more and 40 parts by mass or less, may be in a range of 3 parts by mass or more and 30 parts by mass or less, may be in a range of 4 parts by mass or more and 25 parts by mass or less, and may be in a range of 5 parts by mass or more and 20 parts by mass or less, relative to 100 parts by mass of the resin.

The content of the fifth fluorescent material contained in the wavelength conversion member-forming composition may be in a range of 5 parts by mass or more and 100 parts by mass or less, may be in a range of 10 parts by mass or more and 80 parts by mass or less, may be in a range of 15 parts by mass or more and 60 parts by mass or less, and may be in a range of 20 parts by mass or more and 50 parts by mass or less, relative to 100 parts by mass of the resin. When the wavelength conversion member-forming composition contains a fifth fluorescent material and the fifth fluorescent material contains two or more types of fluorescent materials, the content of the fifth fluorescent material refers to the total content of the two or more types of the fifth fluorescent materials. When the wavelength conversion member-forming composition contains two or more types of fluorescent materials of any of the second to fourth fluorescent materials, the content thereof refers to the total content of the two or more types of the fluorescent materials.

In the wavelength conversion member-forming composition, the total content of the fluorescent materials may be in a range of 50 parts by mass or more and 300 parts by mass or less, may be in a range of 100 parts by mass or more and 280 parts by mass or less, may be in a range of 120 parts by mass or more and 250 parts by mass or less, and may be in a range of 150 parts by mass or more and 200 parts by mass or less, relative to 100 parts by mass of the resin.

The wavelength conversion member may include a translucent body. The translucent body can use a plate-shaped body made of a translucent material such as glass or resin. Examples of the glass include borosilicate glass and quartz glass. Examples of the resin include a silicone resin and an epoxy resin. When the wavelength conversion member includes a substrate, the substrate is preferably made of an insulating material that is difficult to transmit light from the light emitting element and external light. Examples of the material of the substrate include ceramics such as aluminum oxide and aluminum nitride, and resins such as a phenol resin, an epoxy resin, a polyimide resin, a bismaleimide triazine resin (BT resin), and a polyphthalamide (PPA) resin. When an adhesive layer is interposed between the light emitting element and the wavelength conversion member, the adhesive constituting the adhesive layer is preferably made of a material capable of optically connecting the light emitting element and the wavelength conversion member. The material constituting the adhesive layer is preferably at least one resin selected from the group consisting of an epoxy resin, a silicone resin, a phenol resin, and a polyimide resin.

Examples of the semiconductor element optionally provided in the light emitting device include a transistor for controlling the light emitting element and a protective element for suppressing the destruction and the performance deterioration of the light emitting element due to excessive voltage application. Examples of the protective element include a Zener diode. When the light emitting device includes a covering member, it is preferable to use an insulating material as the material of the covering member. More specific examples thereof include a phenol resin, an epoxy resin, a bismaleimide triazine resin (BT resin), a polyphthalamide (PPA) resin, and a silicone resin. A colorant, a fluorescent material, and a filler may be optionally added to the covering member. The light emitting device may use bumps as conductive members. Examples of the material of the bumps include Au and an alloy thereof, and examples of the other conductive member include eutectic solder (Au—Sn), Pb—Sn, and lead-free solder.

Method for Producing Light Emitting Device

An example of the method for producing an exemplary light emitting device according to the first embodiment will be described. For the details, for example, the disclosure of Japanese Unexamined Patent Publication No. 2010-062272 may be referred to. The method for producing a light emitting device preferably includes a step of preparing a molded body, a step of arranging a light emitting element, a step of arranging a wavelength conversion member-forming composition, and a step of forming a resin package. When using an aggregated molded body having a plurality of recessed portions as the molded body, the production method may include an individualizing step of separating each resin package in each unit region after the step of forming a resin package.

In the step of preparing a molded body, a plurality of leads are integrally molded using a thermosetting resin or a thermoplastic resin to prepare a molded body having a recessed portion with side surfaces and a bottom surface. The molded body may be formed from an aggregated substrate including a plurality of recessed portions.

In the step of arranging a light emitting element, the light emitting element is arranged on the bottom surface of the recessed portion of the molded body, and the positive and negative electrodes of the light emitting element are connected to the first lead and the second lead, respectively, by wires.

In the step of arranging a wavelength conversion member-forming composition, the wavelength conversion member-forming composition is arranged in the recessed portion of the molded body.

In the step of forming a resin package, the wavelength conversion member-forming composition arranged in the recessed portion of the molded body is cured to form a resin package, thereby producing a light emitting device. When using a molded body formed from an aggregated substrate having a plurality of recessed portions, in the individualizing step after the step of forming a resin package, the resin package is separated for each resin package in each unit region of the aggregated substrate having a plurality of recessed portions, thereby producing individual light emitting devices. As described above, the light emitting devices shown in FIGS. 1 and 2 can be produced.

An example of the method for producing an exemplary light emitting device according to the second embodiment will be described. For the details, for example, the disclosure of Japanese Unexamined Patent Publication No. 2014-112635 or Japanese Unexamined Patent Publication No. 2017-117912 may be referred to. The method for producing a light emitting device preferably includes a step of arranging a light emitting element, optionally a step of arranging a semiconductor element, a step of forming a wavelength conversion member including a wavelength conversion body, a step of adhering a light emitting element and a wavelength conversion member, and a step of forming a covering member.

For example, in the step of arranging a light emitting element, the light emitting element is arranged on the substrate. For example, the light emitting element and the semiconductor element are flip-chip mounted on the substrate. Next, in the step of forming a wavelength conversion member including a wavelength conversion body, the wavelength conversion body may be obtained by forming a plate-shaped, sheet-shaped, or layered wavelength conversion body on one surface of the translucent body by a printing method, an adhesive method, a compression molding method, or an electrodeposition method. For example, in the printing method, the composition for a wavelength conversion body containing a fluorescent material and a resin serving as a binder or a solvent can be printed on one surface of the translucent body to form a wavelength converter member including a wavelength conversion body. Next, in the step of adhering a light emitting element and a wavelength conversion member, the wavelength conversion member is opposed to the light emitting surface of the light emitting element, and the wavelength conversion member is adhered onto the light emitting element by the adhesive layer. Next, in the step of forming a covering member, the side surfaces of the light emitting element and the wavelength conversion member are covered with the composition for a covering member. The covering member is for reflecting light emitted from the light emitting element, and when the light emitting device also includes a semiconductor element, it is preferable to form the covering member such that the semiconductor element is embedded by the covering member. As described above, the light emitting device shown in FIGS. 3A and 3B can be produced.

Method for Producing Oxide Fluorescent Material

The method for producing an oxide fluorescent material includes: preparing a first compound containing at least one first element $M^1$ selected from the group consisting of Li, Na, K, Rb, and Cs, a second compound containing at least one second element $M^2$ selected from the group consisting of Mg, Ca, Sr, Ba, and Zn, a third compound containing at least one third element $M^3$ selected from the group consisting of B, Al, Ga, In, and rare earth elements, a fourth compound containing at least one fourth element $M^4$ selected from the group consisting of Si, Ti, Ge, Zr, Sn, Hf, and Pb, a sixth compound containing Cr, and optionally a fifth compound containing at least one fifth element $M^5$ selected from the group consisting of Eu, Ce, Tb, Pr, Nd, Sm, Yb, Ho, Er, Tm, Ni, and Mn; adjusting and mixing the first compound, the second compound, the third compound, the fourth compound, the sixth compound, and optionally the fifth compound to prepare a raw material mixture such that, when the molar ratio of the at least one fourth element $M^4$ in 1 mol of the composition of the oxide fluorescent material is 5, the molar ratio of the at least one first element $M^1$ is 0.7 or more and 1.3 or less, for example, 1, the molar ratio of the at least one second element $M^2$ is 1.5 or more and 2.5 or less, for example, 2, the molar ratio of the at least one third element $M^3$ is 0.7 or more and 1.3 or less, for example, 1, and the molar ratio of Cr is more than 0 and 0.2 or less; and heat-treating the raw material mixture at a temperature in a range of 1,000° C. or higher and 1,500° C. or lower in an atmosphere containing oxygen to obtain an oxide fluorescent material, wherein at least one selected from the group consisting of the first compound, the second compound, the third compound, the fourth compound, and the sixth compound is an oxide.

Step of Preparing Raw Material Mixture

Raw Materials

The raw materials for producing an oxide fluorescent material include a first compound containing the first element $M^1$, a second compound containing the second element $M^2$, a third compound containing the third element $M^3$, a fourth compound containing the fourth element $M^4$, and a sixth compound containing Cr. Examples of the first compound, the second compound, the third compound, the fourth compound, and the sixth compound include oxides, carbonates, and chlorides, and hydrates of these, respectively. At least one compound selected from the group consisting of the first compound, the second compound, the third compound, the fourth compound, and the sixth compound is an oxide, and two or more compounds may be oxides. The third compound, the fourth compound, and the sixth compound may be oxides. The fifth compound may be an oxide. The first compound, the second compound, the third compound, the fourth compound, the fifth compound, and the sixth compound are preferably in the form of powder.

Specific examples of the first compound include $Li_2O$, $Li_2CO_3$, $LiCl$, $Na_2O$, $Na_2CO_3$, $NaCl$, $K_2O$, $K_2CO_3$, $KCl$, $Rb_2O$, $Rb_2CO_3$, $RbCl$, $Cs_2O$, $Cs_2CO_3$, and $CsCl$. Specific examples of the second compound include $MgO$, $MgCO_3$, $MgCl_2$, $CaO$, $CaCO_3$, $CaCl_2$, $SrO$, $SrCO_3$, $SiCl_2$, $BaO$, $BaCO_3$, and $BaCl_2$.

When the third compound contains a rare earth element, the rare earth element contained in the third compound is preferably at least one element selected from the group consisting of Sc, Y, La, Gd, and Lu. When using the fifth compound containing the fifth element $M^5$ as a raw material, the rare earth element contained in the third compound is preferably not the same rare earth element as the fifth element $M^5$. Specific examples of the third compound include $B_2O_3$, $BCl_3$, $H_3BO_3$, $Al_2O_3$, $AlCl_3$, $Ga_2O_3$, $GaCl_3$, $In_2O_3$, $InCl_3$, $Sc_2$ $(CO_3)_3$, $Sc_2O_3$, $ScCl_3$, $Y_2(CO_3)_3$, $Y_2O_3$, $YCl_3$, $La_2O_3$, $Gd_2(CO_3)_3$, $Gd_2O_3$, $GdCl_3$, $Lu_2(CO_3)_3$, $Lu_2O_3$, and $LuCl_3$.

Specific examples of the fourth compound include $SiO_2$, $TiO_2$, $TiCl_4$, $GeO_2$, $GeCl_2$, $ZrO_2$, $ZrCl_4$, $SnO_2$, $SnCl_2$, $HfO_2$, $HfCl_4$, $PbO$, and $Pb_3O_4$. Specific examples of the sixth compound include $Cr_2O_3$, $Cr_2(CO_3)_3$, and $CrCl_3 \cdot 6H_2O$. The compound may be in the form of hydrate.

Examples of the fifth compound containing the fifth element $M^5$ include oxides, carbonates, and chlorides, and hydrates of these. The fifth compound may be an oxide. The fifth compound is preferably in the form of powder. Specific examples of the fifth compound include $Eu_2O_3$, $EuCl_3$, $CeO_2$, $Ce_2O_3$, $Ce_2(CO_3)_3$, $Tb_4O_7$, $TbCl_3$, $Pr_6O_{11}$, $PrCl_3$, $Nd_2(CO_3)_3$, $Nd_2O_3$, $NdCl_3$, $Sm_2(CO_3)_3$, $Sm_2O_3$, $SmCl_3$, $Yb_2O_3$, $YbCl_3$, $Ho_2O_3$, $HoCl_3$, $Er_2O_3$, $ErCl_3$, $Tm_2O_3$, $TmCl_3$, $NiO$, $NiCl_2$, $MnO$, $MnO_2$, $Mn_2O_3$, and $Mn_3O_4$. These compounds may be in the form of hydrate.

Raw Material Mixture

For each compound to be used as a raw material, the first compound, the second compound, the third compound, the fourth compound, and the sixth compound are weighed such that, when the molar ratio of the at least one fourth element $M^4$ in 1 mol of the composition of the oxide fluorescent material to be obtained is 5, for example, the molar ratio of the at least one first element $M^1$ is 0.7 or more and 1.3 or less, for example, 1, the molar ratio of the at least one second element $M^2$ is 1.5 or more and 2.5 or less, for example, 2, the molar ratio of the at least one third element $M^3$ is 0.7 or more and 1.3 or less, for example, 1, and the molar ratio of Cr becomes more than 0 and 0.2 or less; and each compound is mixed to obtain a raw material mixture. In the case where the fifth compound is contained as a raw material, the fifth compound may be weighed such that the molar ratio of the at least one fifth element $M^5$ in 1 mol of the composition of the oxide fluorescent material to be obtained becomes 0.10 or less, and each compound may be mixed to obtain a raw material mixture. The weighed first compound, second compound, third compound, fourth compound, and sixth compound, as well as the fifth compound optionally contained are mixed in wet or in dry to obtain a raw material mixture. The weighed compounds may be mixed using a mixing machine. As the mixing machine, a ball mill, a vibration mill, a roll mill, a jet mill, and the like, which are industrially commonly used, can be used.

For each compound to be used as a raw material, it is preferable to prepare a raw material mixture by weighing and mixing each compound such that the first element $M^1$, the second element $M^2$, the third element $M^3$, the fourth element $M^4$, and Cr contained in each compound, as well as the fifth element $M^5$ optionally contained, satisfy the composition represented by the above-mentioned formula (1).

Flux

The raw material mixture may contain a flux. When the raw material mixture contains a flux, the reaction among the raw materials is more promoted and the solid-phase reaction proceeds more uniformly, so that a fluorescent material having a large particle diameter and excellent light emission characteristics can be obtained. When the temperature of the heat treatment for obtaining a fluorescent material is similar to the temperature at which the liquid phase of the compound used as the flux is formed, the flux promotes the reaction among the raw materials. As the flux, a halide containing at least one element selected from the group consisting of rare earth elements, alkaline earth metal elements, and alkali metal elements can be used. Among the halides, fluoride can be used as the flux. In the case where the element contained in the flux is the same as the at least a part of the elements constituting the oxide fluorescent material, the flux can be added as part of the raw materials of the oxide fluorescent material having the desired composition such that the composition of the oxide fluorescent material has the desired composition, or the flux can be added as a further addition after mixing the raw materials to achieve the desired composition.

Step of Heat-Treating to Obtain Oxide Fluorescent Material

The raw material mixture can be placed in a crucible or a boat made of a material such as graphite or other carbon, boron nitride (BN), alumina ($Al_2O_3$), tungsten (W), or molybdenum (Mo), and heat-treated in a furnace.

Heat Treatment Atmosphere

The heat treatment is preferably performed in an atmosphere containing oxygen. The content of oxygen in the atmosphere is not particularly limited. The content of oxygen in the atmosphere containing oxygen is preferably 5% by volume or more, more preferably 10% by volume or more, and even more preferably 15% by volume or more. The heat treatment is preferably performed in an air atmosphere (oxygen content of 20% by volume or more). When the atmosphere does not contain oxygen, such as an oxygen content of less than 1% by volume, an oxide fluorescent material having the desired composition may not be obtained.

Heat Treatment Temperature

The heat treatment temperature is in a range of 1,000° C. or higher and 1,500° C. or lower, preferably in a range of 1,100° C. or higher and 1,450° C. or lower, and more preferably in a range of 1,200° C. or higher and 1,400° C. or lower. When the heat treatment temperature falls within the range of 1,000° C. or higher and 1,500° C. or lower, decomposition due to heat is suppressed, and a fluorescent material having the desired composition and a stable crystal structure can be obtained.

The heat treatment may be performed a plurality of times of two or more stages. For example, in a two-stage heat treatment, the first-stage heat treatment may be performed at a temperature in a range of 1,000° C. or higher and 1,500° C. or lower, and the second-stage heat treatment may be performed at a temperature in a range of 1,100° C. or higher and 1,400° C. or lower. When the first-stage heat treatment temperature falls within the range of 1,000° C. or higher and 1,500° C. or lower, a heat-treated product having the desired composition can be easily obtained. When the second-stage heat treatment temperature falls within the range of 1,100° C. or higher and 1,400° C. or lower, a fluorescent material having a stable crystal structure can be obtained.

In the heat treatment, a maintaining time at a predetermined temperature may be set up. For example, a maintaining time at room temperature in a range of 20° C. or higher and 28° C. or lower may be set up between the first-stage heat treatment and the second-stage heat treatment. The maintaining time may be, for example, in a range of 0.5 hour or more and 48 hours or less, may be in a range of 1 hour or more and 40 hours or less, and may be in a range of 2 hours or more and 30 hours or less. By setting the maintaining time in the range of 0.5 hour or more and 48 hours or less, the crystal growth can be promoted.

The pressure in the heat treatment atmosphere may be standard atmospheric pressure (0.101 MPa), and may be 0.101 MPa or more; and the heat treatment is preferably performed in a pressurized atmosphere range of 0.11 MPa or more and 200 MPa or less. In the heat-treated product to be obtained by the heat treatment, the crystal structure is more readily decomposed at a higher heat treatment temperature, but in a pressurized atmosphere, the decomposition of the crystal structure can be suppressed and the decrease in light emission intensity can be suppressed. The pressure in the heat treatment atmosphere is more preferably in a range of 0.11 MPa or more and 100 MPa or less, and even more preferably in a range of 0.5 MPa or more and 10 MPa or less in terms of gauge pressure; and from the viewpoint of easiness in production, the pressure is further more preferably 1.0 MPa or less.

The heat treatment time can be appropriately selected depending on the heat treatment temperature and the pressure of the atmosphere during the heat treatment, and is preferably in a range of 0.5 hour or more and 20 hours or less. Even in the case of performing two or more stages of heat treatment, the time for one heat treatment is preferably in a range of 0.5 hour or more and 20 hours or less. When the heat treatment time falls within the range of 0.5 hour or more and 20 hours or less, the decomposition of the resulting heat-treated product is suppressed, and a fluorescent material having a stable crystal structure and the desired light emission intensity can be obtained. In addition, the production cost can be reduced and the production time can be relatively shortened. The heat treatment time is more preferably in a range of 1 hour or more and 10 hours or less, and even more preferably in a range of 1.5 hours or more and 9 hours or less.

The heat-treated product obtained by the heat treatment may be subjected to post-treatments such as pulverization, dispersion, solid-liquid separation, and drying. The solid-liquid separation can be performed according to an industrially commonly used method such as filtration, suction filtration, pressure filtration, centrifugation, or decantation. The drying can be performed using an industrially commonly used apparatus such as a vacuum dryer, a hot air heating dryer, a conical dryer, or a rotary evaporator.

EXAMPLES

The present disclosure is hereunder specifically described by reference to the following Examples. The present disclosure is not limited to these Examples.

Oxide Fluorescent Material

Example 1

As raw materials, 2.77 g of $K_2CO_3$, 11.81 g of $SrCO_3$, 2.76 g of $Sc_2O_3$, 20.93 g of $GeO_2$, and 0.10 g of $Cr_2O_3$ were weighed and used. Each element in 1 mol of the composition of the oxide fluorescent material to be obtained was weighed such that the molar ratio of each element in the charged composition was $KSr_2ScGe_5O_{14}:Cr_{0.03}$. Here, in the charged composition, the molar ratio of the element for which the molar ratio is not described is 1. Using an agate mortar and an agate pestle, each raw material was mixed for 10 minutes to obtain a raw material mixture. The resulting raw material mixture was placed in an alumina crucible and heat-treated at 1,150° C. for 8 hours in an air atmosphere (20% by volume of oxygen) with standard air pressure (0.101 MPa). After the heat treatment, the resulting heat-treated product was pulverized to obtain an oxide fluorescent material of Example 1.

Example 2

As raw materials, 2.12 g of $Na_2CO_3$, 11.81 g of $SrCO_3$, 2.76 g of $Sc_2O_3$, 20.93 g of $GeO_2$, and 0.10 g of $Cr_2O_3$ were weighed and used. An oxide fluorescent material of Example 2 was obtained in the same manner as in Example 1 except that each element in 1 mol of the composition of the oxide fluorescent material to be obtained was weighed such that the molar ratio of each element in the charged composition was $NaSr_2ScGe_5O_{14}:Cr_{0.03}$.

Example 3

As raw materials, 2.12 g of $Na_2CO_3$, 11.81 g of $SrCO_3$, 3.76 g of $Ga_2O_3$, 20.93 g of $GeO_2$, and 0.10 g of $Cr_2O_3$ were weighed and used. An oxide fluorescent material of Example 3 was obtained in the same manner as in Example 1 except that each element in 1 mol of the composition of the oxide fluorescent material to be obtained was weighed such that the molar ratio of each element in the charged composition was $NaSr_2GaGe_5O_{14}:Cr_{0.03}$.

Example 4

As raw materials, 2.12 g of $Na_2CO_3$, 8.01 g of $CaCO_3$, 2.76 g of $Sc_2O_3$, 20.93 g of $GeO_2$, and 0.10 g of $Cr_2O_3$ were weighed and used. An oxide fluorescent material of Example 4 was obtained in the same manner as in Example 1 except that each element in 1 mol of the composition of the oxide fluorescent material to be obtained was weighed such that the molar ratio of each element in the charged composition was $NaCa_2ScGe_5O_{14}:Cr_{0.03}$.

Example 5

As raw materials, 2.12 g of $Na_2CO_3$, 11.81 g of $SrCO_3$, 2.04 g of $Al_2O_3$, 20.93 g of $GeO_2$, and 0.10 g of $Cr_2O_3$ were weighed and used. An oxide fluorescent material of Example 5 was obtained in the same manner as in Example 1 except that each element in 1 mol of the composition of the oxide fluorescent material to be obtained was weighed such that the molar ratio of each element in the charged composition was $NaSr_2AlGe_5O_{14}:Cr_{0.03}$.

Example 6

As raw materials, 2.12 g of $Na_2CO_3$, 11.81 g of $SrCO_3$, 5.56 g of $In_2O_3$, 20.93 g of $GeO_2$, and 0.10 g of $Cr_2O_3$ were weighed and used. An oxide fluorescent material of Example 6 was obtained in the same manner as in Example 1 except that each element in 1 mol of the composition of the oxide fluorescent material to be obtained was weighed such that the molar ratio of each element in the charged composition was $NaSr_2InGe_5O_{14}:Cr_{0.03}$.

Example 7

As raw materials, 2.12 g of $Na_2CO_3$, 6.75 g of $MgCO_3$, 2.76 g of $Sc_2O_3$, 20.93 g of $GeO_2$, and 0.10 g of $Cr_2O_3$ were weighed and used. An oxide fluorescent material of Example 7 was obtained in the same manner as in Example 1 except that each element in 1 mol of the composition of the oxide fluorescent material to be obtained was weighed such that the molar ratio of each element in the charged composition was $NaMg_2ScGe_5O_{14}:Cr_{0.03}$.

Example 8

As raw materials, 2.12 g of $Na_2CO_3$, 8.01 g of $CaCO_3$, 2.04 g of $Al_2O_3$, 20.93 g of $GeO_2$, and 0.10 g of $Cr_2O_3$ were weighed and used. An oxide fluorescent material of Example 8 was obtained in the same manner as in Example 1 except that each element in 1 mol of the composition of the oxide fluorescent material to be obtained was weighed such that the molar ratio of each element in the charged composition was $NaCa_2AlGe_5O_{14}:Cr_{0.03}$, and the heat treatment was performed at 1,120° C.

Example 9

As raw materials, 2.12 g of $Na_2CO_3$, 8.01 g of $CaCO_3$, 5.56 g of $In_2O_3$, 20.93 g of $GeO_2$, and 0.10 g of $Cr_2O_3$ were weighed and used. An oxide fluorescent material of Example 9 was obtained in the same manner as in Example 1 except that each element in 1 mol of the composition of the oxide fluorescent material to be obtained was weighed such that the molar ratio of each element in the charged composition was $NaCa_2InGe_5O_{14}:Cr_{0.03}$, and the heat treatment was performed at 1,120° C.

Example 10

As raw materials, 2.77 g of $K_2CO_3$, 8.01 g of $CaCO_3$, 2.76 g of $Sc_2O_3$, 20.93 g of $GeO_2$, and 0.10 g of $Cr_2O_3$ were weighed and used. An oxide fluorescent material of Example 10 was obtained in the same manner as in Example 1 except that each element in 1 mol of the composition of the oxide fluorescent material to be obtained was weighed such that the molar ratio of each element in the charged composition was $KCa_2ScGe_5O_{14}:Cr_{0.03}$, and the heat treatment was performed at 1,120° C.

Example 11

As raw materials, 2.77 g of $K_2CO_3$, 8.01 g of $CaCO_3$, 2.04 g of $Al_2O_3$, 20.93 g of $GeO_2$, and 0.10 g of $Cr_2O_3$ were weighed and used. An oxide fluorescent material of Example 11 was obtained in the same manner as in Example 1 except that each element in 1 mol of the composition of the oxide fluorescent material to be obtained was weighed such that the molar ratio of each element in the charged composition was $KCa_2AlGe_5O_{14}:Cr_{0.03}$, and the heat treatment was performed at 1,120° C.

Example 12

As raw materials, 2.77 g of $K_2CO_3$, 8.01 g of $CaCO_3$, 5.56 g of $In_2O_3$, 20.93 g of $GeO_2$, and 0.10 g of $Cr_2O_3$ were weighed and used. An oxide fluorescent material of Example 12 was obtained in the same manner as in Example 1 except that each element in 1 mol of the composition of the oxide fluorescent material to be obtained was weighed such that the molar ratio of each element in the charged composition was $KCa_2InGe_5O_{14}:Cr_{0.03}$, and the heat treatment was performed at 1,120° C.

Example 13

As raw materials, 2.12 g of $Na_2CO_3$, 11.81 g of $SrCO_3$, 2.76 g of $Sc_2O_3$, 12.60 g of $GeO_2$, 4.81 g of $SiO_2$, and 0.10 g of $Cr_2O_3$ were weighed and used. An oxide fluorescent material of Example 13 was obtained in the same manner as in Example 1 except that each element in 1 mol of the composition of the oxide fluorescent material to be obtained was weighed such that the molar ratio of each element in the charged composition was $NaSr_2ScGe_3Si_2O_{14}:Cr_{0.03}$, and the heat treatment was performed at 1,180° C.

Example 14

As raw materials, 4.62 g of $Rb_2CO_3$, 8.01 g of $CaCO_3$, 2.76 g of $Sc_2O_3$, 20.93 g of $GeO_2$, and 0.10 g of $Cr_2O_3$ were weighed and used. An oxide fluorescent material of Example 14 was obtained in the same manner as in Example 1 except that each element in 1 mol of the composition of the oxide fluorescent material to be obtained was weighed such that the molar ratio of each element in the charged composition was $RbCa_2ScGe_5O_{14}:Cr_{0.03}$, and the heat treatment was performed at 1,120° C.

Example 15

As raw materials, 1.48 g of $Li_2CO_3$, 8.01 g of $CaCO_3$, 2.76 g of $Sc_2O_3$, 20.93 g of $GeO_2$, and 0.10 g of $Cr_2O_3$ were weighed and used. An oxide fluorescent material of Example 15 was obtained in the same manner as in Example 1 except that each element in 1 mol of the composition of the oxide fluorescent material to be obtained was weighed such that the molar ratio of each element in the charged composition was $LiCa_2ScGe_5O_{14}:Cr_{0.03}$, and the heat treatment was performed at 1,120° C.

Example 16

As raw materials, 2.77 g of $K_2CO_3$, 11.81 g of $SrCO_3$, 2.76 g of $Sc_2O_3$, 20.93 g of $GeO_2$, 0.10 g of $Cr_2O_3$, and 0.08 g of $Yb_2O_3$ were weighed and used. An oxide fluorescent material of Example 16 was obtained in the same manner as in Example 1 except that each element in 1 mol of the composition of the oxide fluorescent material to be obtained was weighed such that the molar ratio of each element in the charged composition was $KSr_2ScGe_5O_{14}:Cr_{0.03},Yb_{0.01}$.

Example 17

As raw materials, 2.12 g of $Na_2CO_3$, 11.81 g of $SrCO_3$, 2.76 g of $Sc_2O_3$, 20.93 g of $GeO_2$, 0.10 g of $Cr_2O_3$, and 0.08 g of $Yb_2O_3$ were weighed and used. An oxide fluorescent material of Example 17 was obtained in the same manner as in Example 1 except that each element in 1 mol of the composition of the oxide fluorescent material to be obtained was weighed such that the molar ratio of each element in the charged composition was $NaSr_2ScGe_5O_{14}:Cr_{0.03},Yb_{0.01}$.

Example 18

As raw materials, 2.12 g of $Na_2CO_3$, 11.81 g of $SrCO_3$, 5.56 g of $In_2O_3$, 20.93 g of $GeO_2$, 0.10 g of $Cr_2O_3$, and 0.08 g of $Yb_2O_3$ were weighed and used. An oxide fluorescent material of Example 18 was obtained in the same manner as in Example 1 except that each element in 1 mol of the composition of the oxide fluorescent material to be obtained was weighed such that the molar ratio of each element in the charged composition was $NaSr_2InGe_5O_{14}:Cr_{0.03},Yb_{0.01}$.

Measurement of Light Emission Spectrum and Light Emission Characteristics

Figure 4:
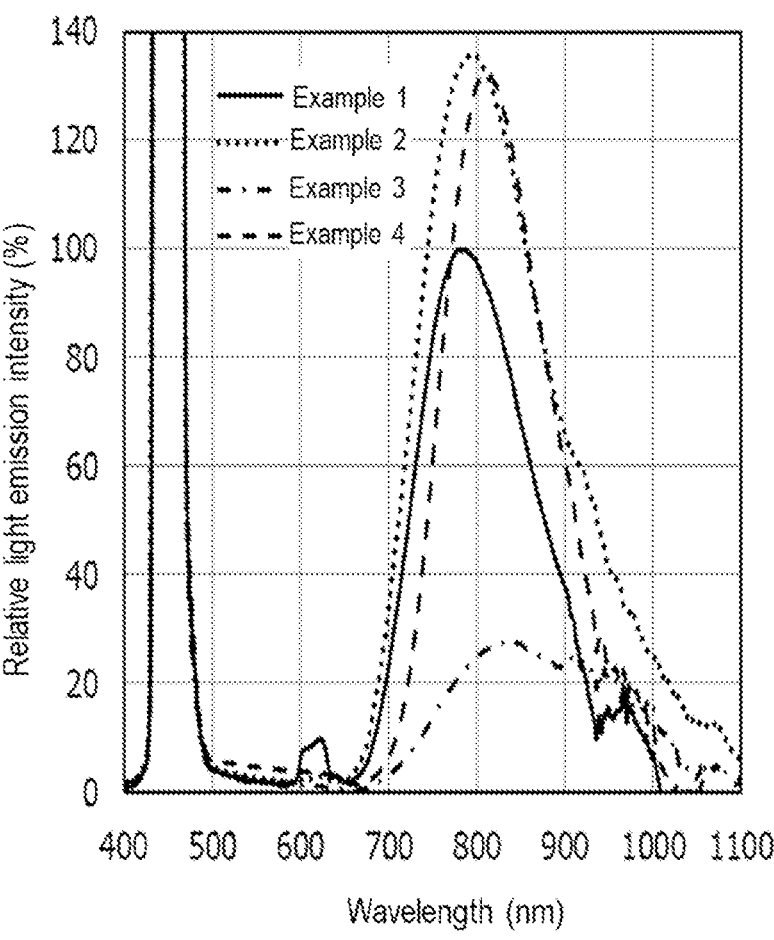
FIG. 4 is a graph showing light emission spectra of the oxide fluorescent materials according to Examples 1 to 4.
Figure 5:
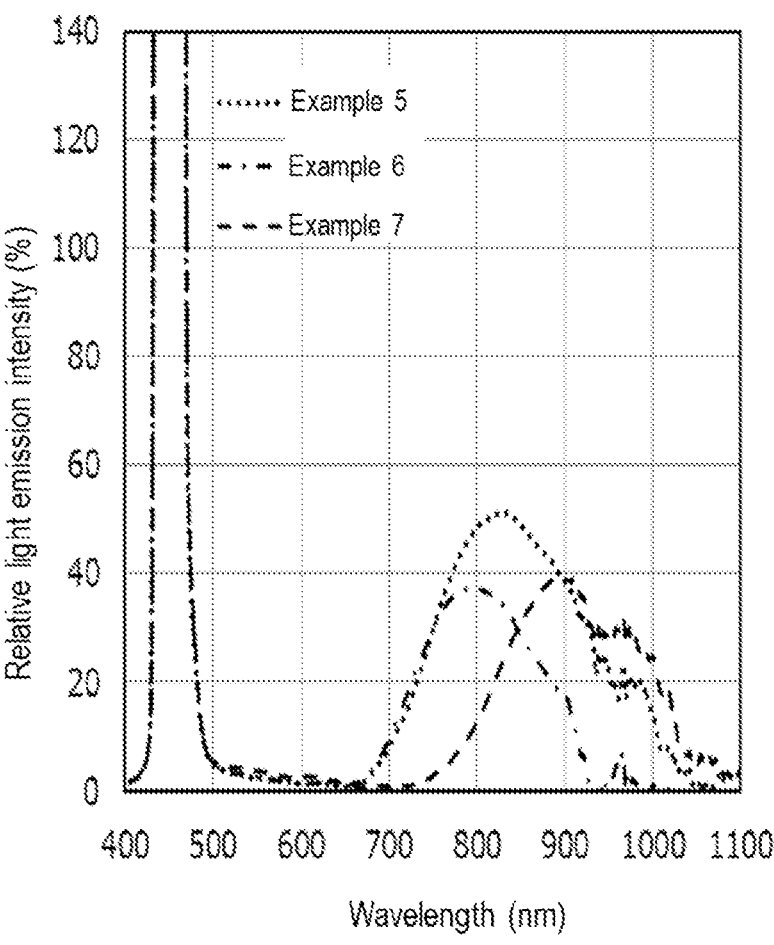
FIG. 5 is a graph showing light emission spectra of the oxide fluorescent materials according to Examples 5 to 7.
Figure 6:
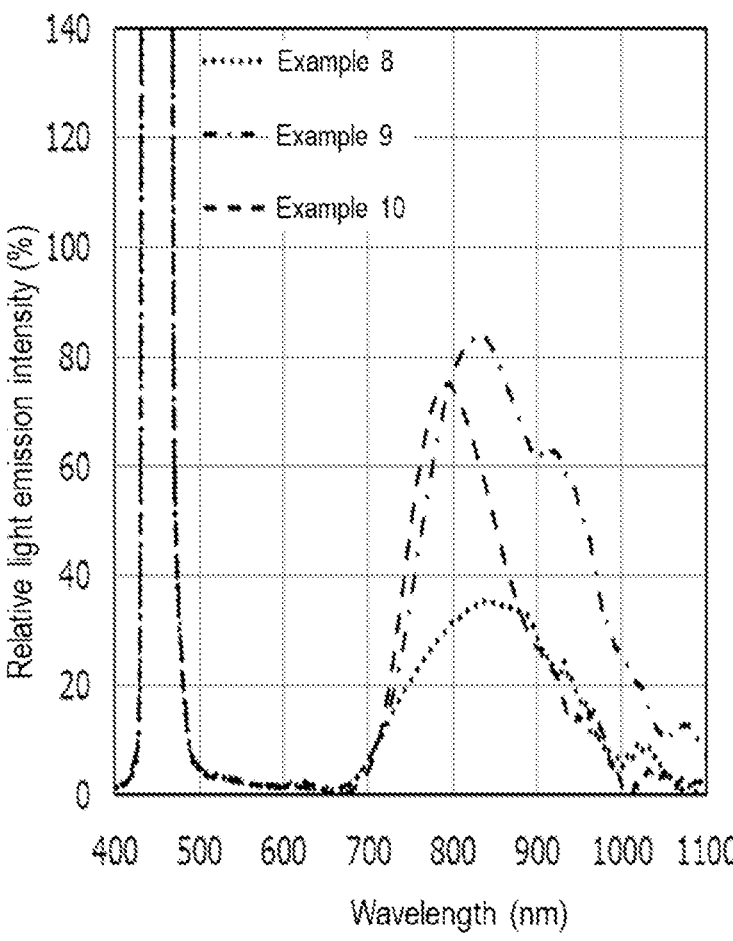
FIG. 6 is a graph showing light emission spectra of the oxide fluorescent materials according to Examples 8 to 10.
Figure 7:
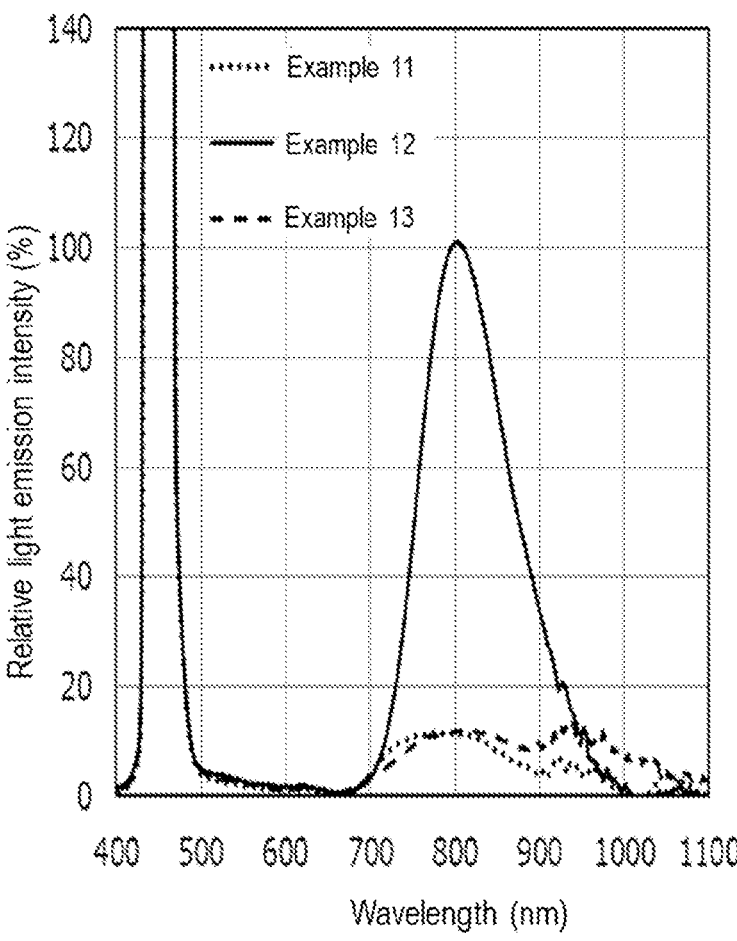
FIG. 7 is a graph showing light emission spectra of the oxide fluorescent materials according to Examples 11 to 13.
Figure 8:
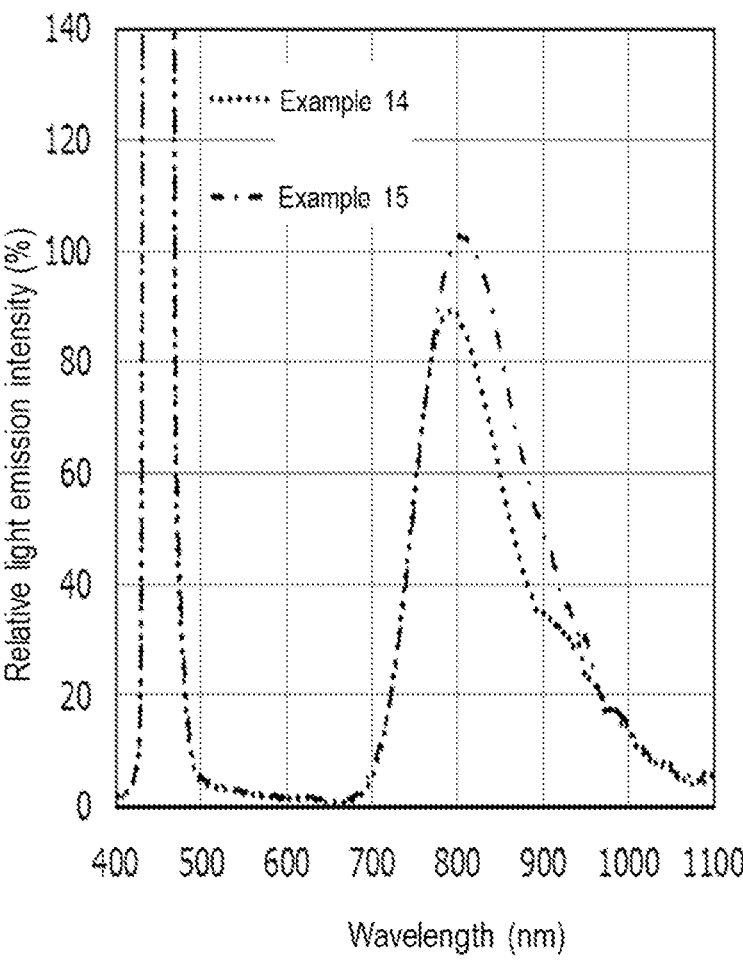
FIG. 8 is a graph showing light emission spectra of the oxide fluorescent materials according to Examples 14 to 15.
Figure 9:
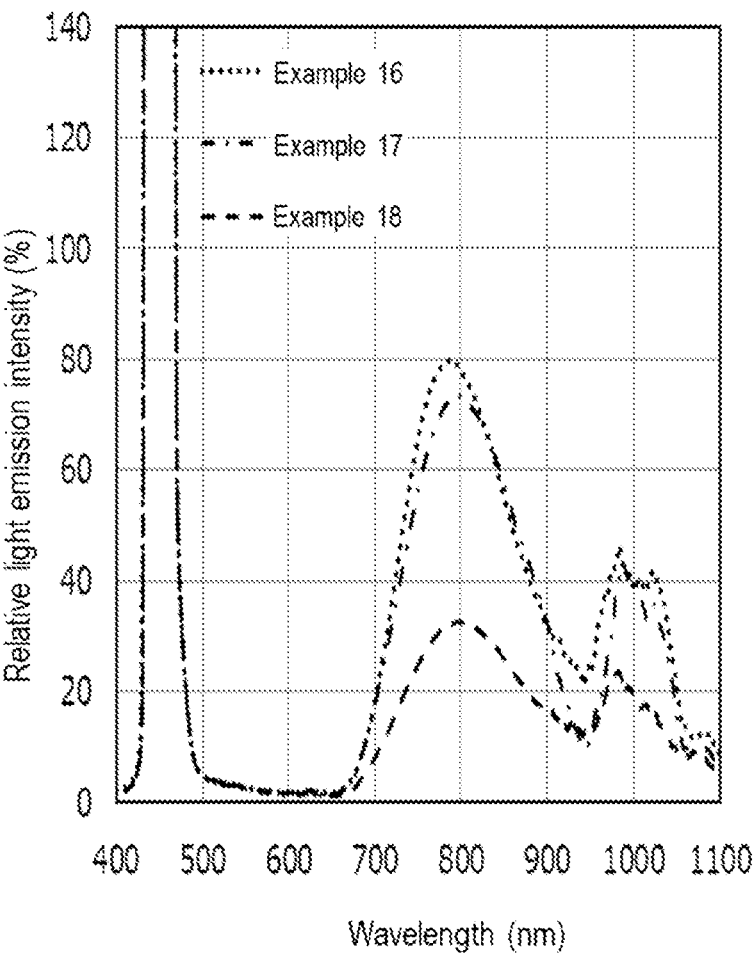
FIG. 9 is a graph showing light emission spectra of the oxide fluorescent materials according to Examples 16 to 18.

As for each fluorescent material contained in the oxide fluorescent material in each Example, the light emission spectrum was measured using a quantum efficiency measurement system (QE-2000, manufactured by Otsuka Electronics Co., Ltd.). The light emission peak wavelength of the excitation light used in the quantum efficiency measurement system was 450 nm. From the obtained light emission spectrum of each fluorescent material, the relative light emission intensity, light emission peak wavelength, and full width at half maximum were determined as light emission characteristics. That is, in the light emission spectrum of each fluorescent material, the light emission peak wavelength ($\lambda p$) (nm) and the full width at half maximum (FWHM) (nm) of the light emission peak in the range of 700 nm or more and 1,050 nm or less were determined. Further, the light emission intensity at the light emission peak wavelength of the oxide fluorescent material according to Example 1 was defined as 100%, and the relative light emission intensity (%) at the light emission peak wavelength of the oxide fluorescent material according to each of Examples 2 to 18 was measured. The results are shown in Table 1. FIGS. 4 to 9 show the light emission spectra of the excitation light and the oxide fluorescent material according to each of Examples 1 to 8. FIGS. 4 and 5 show the light emission spectra of the oxide fluorescent material according to each Example when the maximum light emission peak of the oxide fluorescent material in Example 1 is defined as 100%. FIGS. 6 to 9 show the light emission spectra of the oxide fluorescent material according to each Example when the maximum light emission peak of the oxide fluorescent material in Example 12 is defined as 100%. In each of FIGS. 4 to 9, the light emission spectrum having a light emission peak wavelength in a range of 400 nm or more and 500 nm or less is the light emission spectrum of the excitation light source.

Measurement of Excitation Spectrum

Figure 10:
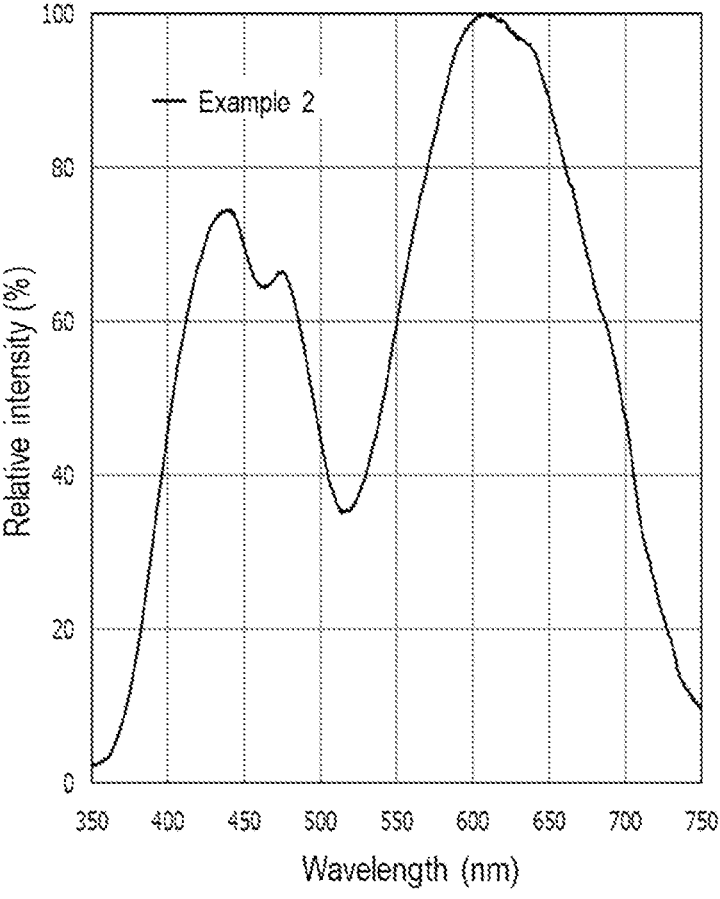
FIG. 10 is a graph showing an excitation spectrum of the oxide fluorescent material according to Example 2.

As for the oxide fluorescent material in Example 2, the excitation spectrum was measured in a range of 350 nm or more and 750 nm or less at the light emission peak wavelength of the oxide fluorescent material, at room temperature (20° C. to 25° C.) using a fluorescence spectrophotometer (F-4500, manufactured by Hitachi High-Technologies Corp.). The maximum intensity of the excitation spectrum of the oxide fluorescent material was defined as 100%, and the relative intensity (%) at each wavelength was used as the excitation spectrum pattern. FIG. 10 shows the excitation spectrum of the oxide fluorescent material according to Example 2.

TABLE 1

| | | Light emission characteristics | | |
| | Charged composition | Relative light emission intensity (%) | Light emission peak wavelength $\lambda p$ (nm) | Full width at half maximum (FWHM) (nm) |
|---|---|---|---|---|
| Example 1 | $KSr_2ScGe_5O_{14}:Cr_{0.03}$ | 100.0 | 785 | 158 |
| Example 2 | $NaSr_2ScGe_5O_{14}:Cr_{0.03}$ | 135.8 | 795 | 172 |
| Example 3 | $NaSr_2GaGe_5O_{14}:Cr_{0.03}$ | 28.0 | 834 | 246 |
| Example 4 | $NaCa_2ScGe_5O_{14}:Cr_{0.03}$ | 132.4 | 811 | 139 |
| Example 5 | $NaSr_2AlGe_5O_{14}:Cr_{0.03}$ | 51.1 | 832 | 190 |
| Example 6 | $NaSr_2InGe_5O_{14}:Cr_{0.03}$ | 37.1 | 802 | 169 |
| Example 7 | $NaMg_2ScGe_5O_{14}:Cr_{0.03}$ | 39.4 | 897 | 188 |
| Example 8 | $NaCa_2AlGe_5O_{14}:Cr_{0.03}$ | 35.6 | 839 | 210 |
| Example 9 | $NaCa_2InGe_5O_{14}:Cr_{0.03}$ | 83.8 | 835 | 212 |
| Example 10 | $KCa_2ScGe_5O_{14}:Cr_{0.03}$ | 75.1 | 795 | 131 |
| Example 11 | $KCa_2AlGe_5O_{14}:Cr_{0.03}$ | 11.8 | 782 | 131 |
| Example 12 | $KCa_2InGe_5O_{14}:Cr_{0.03}$ | 100.9 | 804 | 123 |
| Example 13 | $NaSr_2ScGe_5Si_2O_{14}:Cr_{0.03}$ | 12.2 | 814 | 294 |
| Example 14 | $RbCa_2ScGe_5O_{14}:Cr_{0.03}$ | 89.4 | 796 | 130 |
| Example 15 | $LiCa_2ScGe_5O_{14}:Cr_{0.03}$ | 102.8 | 803 | 150 |
| Example 16 | $KSr_2ScGe_5O_{14}:Cr_{0.03},Yb_{0.01}$ | 79.8 | 786 | 157 |
| Example 17 | $NaSr_2ScGe_5O_{14}:Cr_{0.03},Yb_{0.01}$ | 73.5 | 799 | 167 |
| Example 18 | $NaSr_2InGe_5O_{14}:Cr_{0.03},Yb_{0.01}$ | 32.5 | 795 | 181 |

The oxide fluorescent materials according to Examples 1 to 18 had a light emission peak wavelength in the range of 700 nm or more and 1,050 nm or less in the light emission spectrum, and had a full width at half maximum of 100 nm or more. The oxide fluorescent materials according to Examples 1 to 18 had a light emission peak wavelength in the wavelength range from red light to near infrared light, and had a light emission spectrum with a wide full width at half maximum of 100 nm or more.

As shown in FIGS. 4 to 9, the oxide fluorescent materials according to Examples 1 to 18 had a light emission peak wavelength in the range of 700 nm or more and 1,050 nm or less, and had a full width at half maximum of 100 nm or more. Specifically, they had a light emission peak wavelength in the range of 750 nm or more and 850 nm or less, and exhibited a wide light emission peak with a full width at half maximum of 120 nm or more. In addition, the oxide fluorescent materials according to Examples 1 to 18 had a light emission peak wavelength with a wide full width at half maximum.

As shown in FIG. 10, the oxide fluorescent material according to Example 2 had intensity peaks in the range of 420 nm or more and 460 nm or less and in the range of 570 nm or more and 630 nm or less in the excitation spectrum. It can be seen that the oxide fluorescent material according to Example 2 emits light efficiently by emitting light in the wavelength range of 420 nm or more and 460 nm or less and the range of 570 nm or more and 630 nm or less.

Light Emitting Device According to Example 19

The oxide fluorescent material according to Example 2 and the oxide fluorescent material according to Example 7 were used as the first fluorescent material. As the second fluorescent material, a phosphate fluorescent material having a composition represented by the above formula (2a) was used. As the third fluorescent material, a silicate fluorescent material having a composition represented by the above formula (3a) and an aluminate fluorescent material having a composition represented by the above formula (3b) were used. As the fourth fluorescent material, a nitride fluorescent material having a composition represented by the above formula (4a) and a fluoro-germanate fluorescent material having a composition represented by the above formula (4b)

were used. As the fifth fluorescent material, a gallate fluorescent material having a composition represented by the above formula (5a) was used. The first fluorescent material, the second fluorescent material, the third fluorescent material, the fourth fluorescent material, and the fifth fluorescent material were mixed and dispersed with a silicone resin so as to have the composition shown in Table 2, and then defoamed to obtain a wavelength conversion member-forming composition. The total content of the fluorescent materials in the wavelength conversion member-forming composition was 184.7 parts by mass relative to 100 parts by mass of the resin. Next, a molded body having a recessed portion was prepared as shown in FIG. 2; a light emitting element having a light emission peak wavelength of 420 nm and having a gallium nitride-based compound semiconductor was arranged at a first lead on the bottom surface of the recessed portion; and the wavelength conversion member-forming composition was then injected and filled over the light emitting element, followed by heating to cure the resin in the wavelength conversion member-forming composition. The full width at half maximum of the light emission spectrum of the light emitting element was 15 nm. A light emitting device according to Example 19 was produced through these processes.

Light Emitting Device According to Comparative Example

An aluminate fluorescent material having a composition represented by the above formula (3b) was mixed and dispersed with a silicone resin, and then defoamed to obtain a wavelength conversion member-forming composition. The content of the fluorescent material in the wavelength conversion member-forming composition was 35 parts by mass relative to 100 parts by mass of the resin. A light emitting device was produced in the same manner as the light emitting device according to Example 19 except that the above wavelength conversion member-forming composition was used and a light emitting element having a gallium nitride-based compound semiconductor with a light emission peak wavelength of 450 nm was used; and the light emitting device was used as a light emitting device according to Comparative Example.

Measurement of Light Emission Spectrum

As for the light emitting device according to Example 19 and the light emitting device according to Comparative Example, the light emission spectrum at room temperature (25° C.±5° C.) was measured using an optical measurement system combining a spectrophotometer (PMA-11, Hamamatsu Photonics K.R.) and an integral sphere. For each light emitting device, the maximum value of the light emission intensity in the range of the light emission peak wavelength of the light emitting element or more and 1,050 nm or less was defined as 100% in the light emission spectrum, and the minimum value of the relative light emission intensity in the range of the light emission peak wavelength of the light emitting element or more and 1,050 nm or less was determined (minimum value of relative light emission intensity (%)=minimum value of light emission intensity/maximum value of light emission intensity×100). The results are shown in Table 2.

Comparative Example is enlarged. The light emitting device according to Comparative Example emitted white mixed light. Within the range of 450 nm (the light emission peak wavelength of the light emitting device) or more and 1,050 nm or less, the light emitting device according to Comparative Example had a light emission spectrum having a portion with 0% of the light emission intensity in the wavelength range of 900 nm or more, which was not continuous in the range of 450 nm or more and 1,050 nm or less. From the light emission spectrum of the light emitting device according to Comparative Example, it is confirmed that no light was emitted in the range of 900 nm or more and 1,050 nm, which was included in the near-infrared wavelength range.

The oxide fluorescent material according to the present disclosure can be used in light emitting devices for medical use to obtain information in living bodies, light emitting devices to be mounted on small mobile devices such as smartphones to manage physical conditions, light emitting

TABLE 2

| | Light emitting device in Example 19 Wavelength conversion member-forming composition | | | Light emitting device in Comparative Example Wavelength conversion member-forming composition | | |
|---|---|---|---|---|---|---|
| | Types | Light emission peak wavelength $\lambda p$ (nm) | parts by mass | Types | Light emission peak wavelength $\lambda p$ (nm) | parts by mass |
| Resin | Silicone resin | — | 100.0 | Silicone resin | — | 100.0 |
| First fluorescent material | $NaSr_2ScGe_5O_{14}:Cr_{0.03}$ | 802 | 20.0 | — | — | — |
| | $NaMg_2ScGe_5O_{14}:Cr_{0.03}$ | 897 | 40.0 | — | — | — |
| Second fluorescent material | $Ca_{10}(PO_4)_6Cl_2:Eu$ | 450 | 60.0 | — | — | — |
| Third fluorescent material | $Ca_8MgSi_4O_{16}Cl_2:Eu$ | 520 | 3.7 | $Y_3Al_5O_{12}:Ce$ | — | 35.0 |
| | $Lu_3Al_5O_{12}:Cr$ | 520 | 29.8 | — | — | — |
| Fourth fluorescent material | $(Sr,Ca)AlSiN_3:Eu$ | 620 | 2.7 | — | — | — |
| | $3.5MgO \cdot 0.5MgF_2 \cdot GeO_2:Mn$ | 658 | 3.5 | — | — | — |
| Fifth fluorescent material | $Ga_2O_3:Cr$ | 730 | 25.0 | — | — | — |
| Maximum value of relative light emission intensity (%) | 100 | | | 100 | | |
| Minimum value of relative light emission intensity (%) | 11.2 | | | 0 | | |

Figure 11:
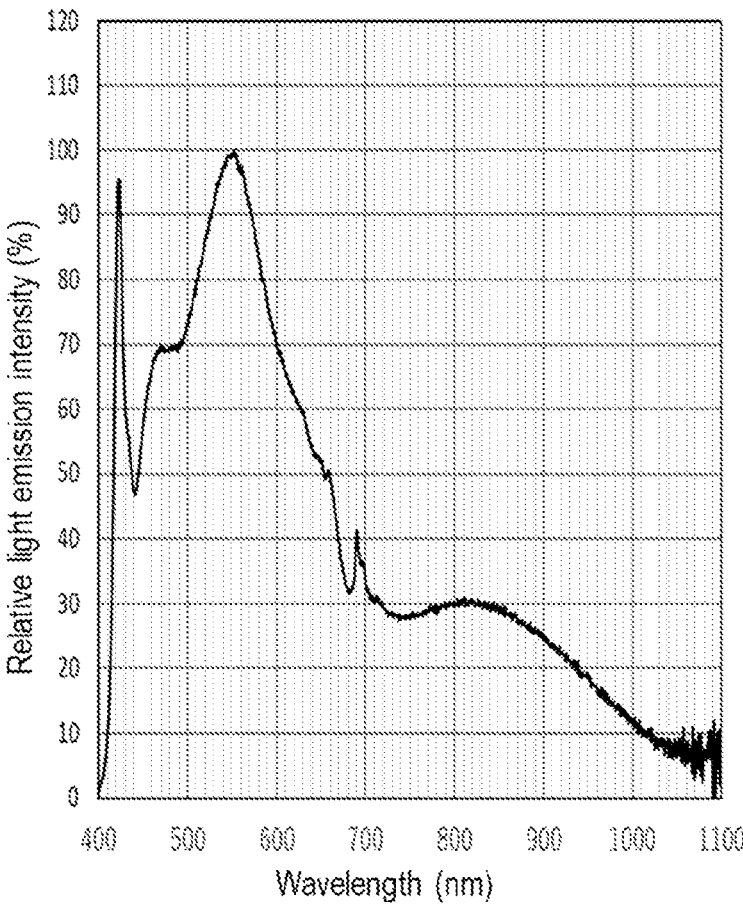
FIG. 11 is a graph showing a light emission spectrum of the light emitting device according to Example 19.

FIG. 11 is a graph showing a light emission spectrum of the light emitting device according to Example 19. In the light emission spectrum of the light emitting device according to Example 19, it is confirmed that the light was continuously emitted within the range of 420 nm (the light emission peak wavelength of the light emitting element) or more and 1,050 nm or less. The light emitting device according to Example 19 emitted light in which when the maximum value of the relative light emission intensity in the range of 420 nm or more and 1,050 nm or less was 100%, the minimum value of the relative light emission intensity in the range of 420 nm or more and 1,050 nm or less was 11.2% in the light emission spectrum.

Figure 12:
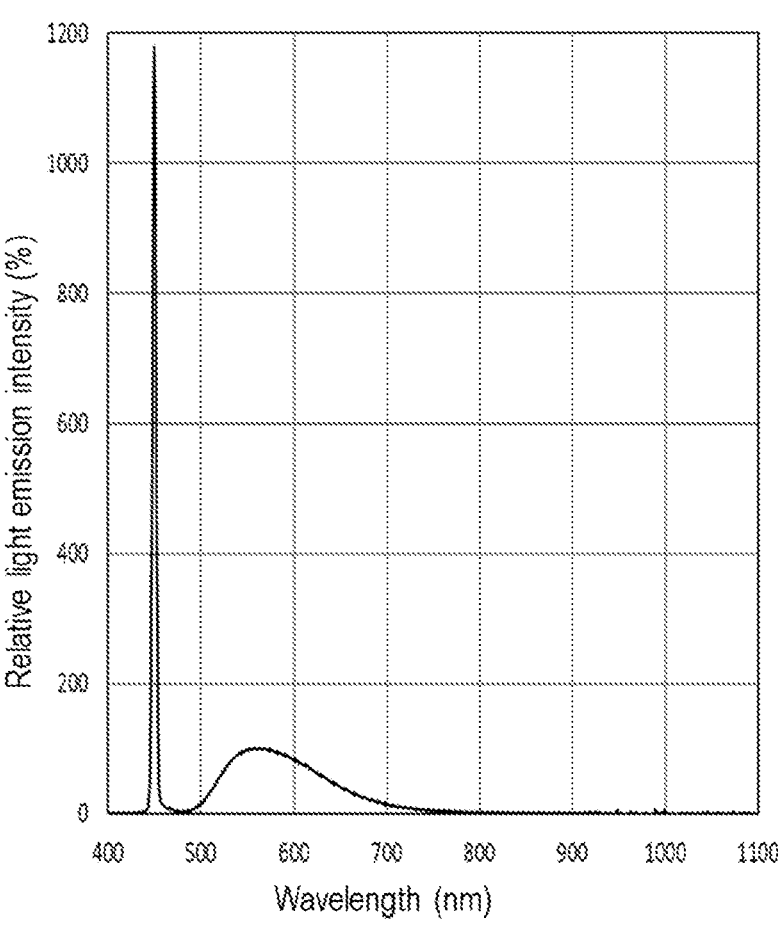
FIG. 12 is a graph showing a light emission spectrum of the light emitting device according to Comparative Example.
Figure 13:
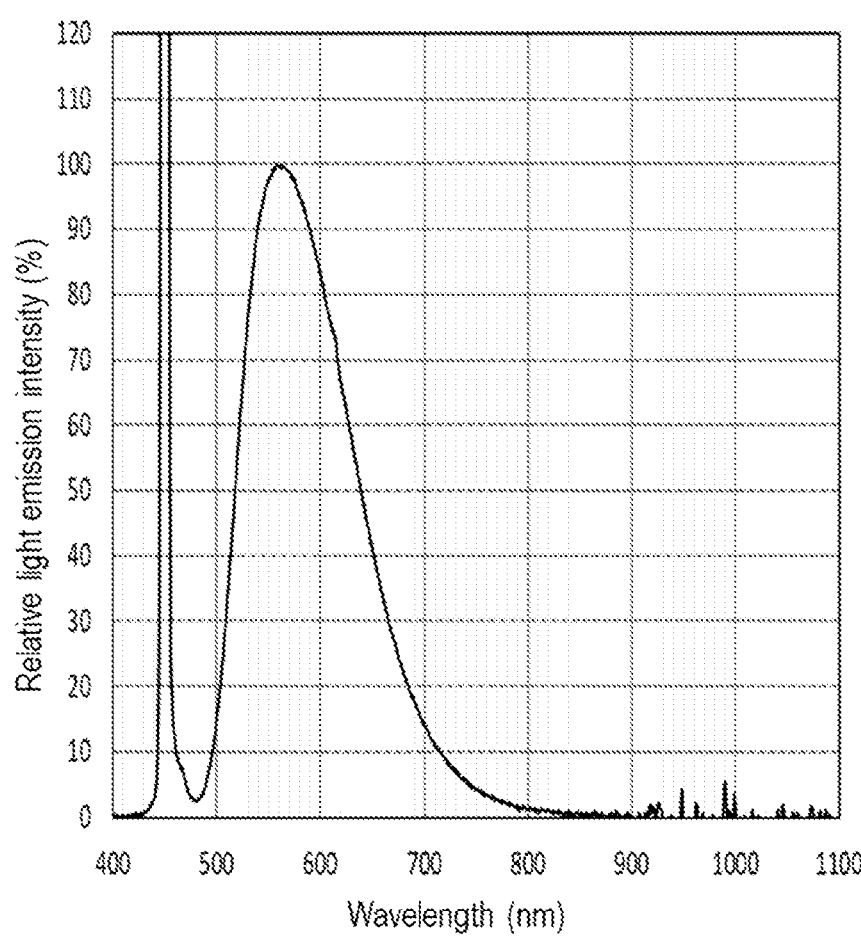
FIG. 13 is an enlarged graph of a part of the light emission spectrum of the light emitting device according to Comparative Example.

FIG. 12 is a graph showing a light emission spectrum of the light emitting device according to Comparative Example, and FIG. 13 is an enlarged graph of the light emission spectrum in which the light emission intensity (vertical axis) of the light emitting device according to devices for analyzers to non-destructively measure the internal information of foods such as fruits and vegetables and rice, light emitting devices for plant cultivation to affect the photoreceptors of plants, and light emitting devices for reflection spectroscopic measuring devices used for measuring film thickness. The light emitting device using the oxide fluorescent material according to the present disclosure can be used in medical devices, small mobile devices, analyzers, plant cultivation systems, and reflection spectroscopic measuring devices.

The invention claimed is:

1. An oxide fluorescent material, having a composition comprising:
   at least one first element $M^1$ selected from the group consisting of Li, Na, K, Rb, and Cs;
   at least one second element $M^2$ selected from the group consisting of Mg, Ca, Sr, Ba, and Zn;

at least one third element $M^3$ selected from the group consisting of B, Al, Ga, In, and rare earth elements;

at least one fourth element $M^4$ that comprises Ge and optionally comprises at least one element selected from the group consisting of Si, Ti, Zr, Sn, Hf, and Pb;

O (oxygen);

Cr; and optionally at least one fifth element $M^5$ selected from the group consisting of Eu, Ce, Tb, Pr, Nd, Sm, Yb, Ho, Er, Tm, Ni, and Mn, wherein the composition is represented by the following formula (1):

$$M^1_t M^2_u M^3_v M^4_5 O_w : Cr_x, M^5_y \qquad (1)$$

wherein t, u, v, w, x, and y each satisfy $0.7 \leq t \leq 1.3$, $1.5 \leq u \leq 2.5$, $0.7 \leq v \leq 1.3$, $12.9 \leq w \leq 15.1$, $0.001 \leq x \leq 0.2$, $0 \leq y \leq 0.10$, and $y < x$, and wherein the oxide fluorescent material has a light emission peak wavelength in a range of 782 nm or more and 1,050 nm or less in a light emission spectrum of the oxide fluorescent material and having a full width at half maximum in a range of 123 nm or more and 400 nm or less in the light emission spectrum.

2. The oxide fluorescent material according to claim 1, wherein the at least one first element $M^1$ comprises at least one element selected from the group consisting of Li, Na, K, and Rb, the at least one second element $M^2$ comprises at least one element selected from the group consisting of Mg, Ca, and Sr, the at least one third element $M^3$ comprises at least one element selected from the group consisting of Sc, Al, Ga, and In, and the optional at least one fifth element $M^5$ comprises at least one element selected from the group consisting of Yb, Nd, Tm, and Er.

3. The oxide fluorescent material according to claim 1, wherein the at least one fourth element $M^4$ consists of Ge.

4. A light emitting device, comprising the oxide fluorescent material according to claim 1 and a light emitting element having a light emission peak wavelength in a range of 365 nm or more and 500 nm or less.

5. The light emitting device according to claim 4, comprising a first fluorescent material containing the oxide fluorescent material, and comprising at least one fluorescent material selected from the group consisting of a second fluorescent material having a light emission peak wavelength in a range of 455 nm or more and less than 495 nm, a third fluorescent material having a light emission peak wavelength in a range of 495 nm or more and less than 610 nm, a fourth fluorescent material having a light emission peak wavelength in a range of 610 nm or more and less than 700 nm, and a fifth fluorescent material having a light emission peak wavelength in a range of 700 nm or more and 1,050 nm or less, wherein the light emitting device has a light emission spectrum in which, when a maximum value of a light emission intensity in a range of the light emission peak wavelength of the light emitting element or more and 1,050 nm or less is 100%, a minimum value of the light emission intensity in the range of the light emission peak wavelength of the light emitting element or more and 1,050 nm or less is 10% or more.

6. The light emitting device according to claim 5, wherein the second fluorescent material comprises at least one fluorescent material selected from the group consisting of a phosphate fluorescent material having a composition represented by the following formula (2a), an aluminate fluorescent material having a composition represented by the following formula (2b), and an aluminate fluorescent material having a composition represented by the following formula (2c):

$$(Ca,Sr,Ba,Mg)_{10}(PO_4)_6(F,Cl,Br,I)_2:Eu \qquad (2a),$$

$$(Ba,Sr,Ca)MgAl_{10}O_{17}:Eu \qquad (2b), \text{ and}$$

$$Sr_4Al_{14}O_{25}:Eu \qquad (2c).$$

7. The light emitting device according to claim 5, wherein the third fluorescent material comprises at least one fluorescent material selected from the group consisting of a silicate fluorescent material having a composition represented by the following formula (3a), an aluminate fluorescent material or a gallate fluorescent material having a composition represented by the following formula (3b), a β-SiAlON fluorescent material having a composition represented by the following formula (3c), a cesium lead halide fluorescent material having a composition represented by the following formula (3d), and a nitride fluorescent material having a composition represented by the following formula (3e):

$$(Ca,Sr,Ba)_8MgSi_4O_{16}(F,Cl,Br)_2:Eu \qquad (3a),$$

$$(Lu,Y,Gd,Tb)_3(Al,Ga)_5O_{12}:Ce \qquad (3b),$$

$$Si_{6-z}Al_zO_zN_{8-z}:Eu(0<z\leq4.2) \qquad (3c),$$

$$CsPb(F,Cl,Br)_3 \qquad (3d), \text{ and}$$

$$(La,Y,Gd)_3Si_6N_{11}:Ce \qquad (3e).$$

8. The light emitting device according to claim 5, wherein the fourth fluorescent material comprises at least one fluorescent material selected from the group consisting of a nitride fluorescent material having a composition represented by the following formula (4a), a fluoro-germanate fluorescent material having a composition represented by the following formula (4b), an oxynitride fluorescent material having a composition represented by the following formula (4c), a fluoride fluorescent material having a composition represented by the following formula (4d), a fluoride fluorescent material having a composition represented by the following formula (4e), a nitride fluorescent material having a composition represented by the following formula (4f), and a nitride fluorescent material having a composition represented by the following formula (4g):

$$(Sr,Ca)AlSiN_3:Eu \qquad (4a),$$

$$3.5MgO{\cdot}0.5MgF_2{\cdot}GeO_2:Mn \qquad (4b),$$

$$(Ca,Sr,Mg)_k Si_{12-(m+n)}Al_{m+n}O_n N_{16-n}:Eu \qquad (4c),$$

wherein k, m, and n each satisfy $0<k\leq2.0$, $2.0\leq m\leq6.0$, and $0\leq n\leq2.0$, $$A_c[M^6_{1-b}Mn^{4+}_b F_d] \qquad (4d),$$

wherein A includes at least one selected from the group consisting of $K^+$, $Li^+$, $Na^+$, $Rb^+$, $Cs^+$, and $NH_4^+$; $M^6$ includes at least one element selected from the group consisting of Group 4 elements and Group 14 elements; b satisfies $0<b<0.2$; c represents the absolute value of the charge of $[M^6_{1-b}Mn^{4+}_b F_d]$ ions; and d satisfies $5<d<7$, $$A'_{c'}[M^{6'}_{1-b}Mn^{4+}_b F_{d'}] \qquad (4e),$$

wherein A' includes at least one selected from the group consisting of $K^+$, $Li^+$, $Na^+$, $Rb^+$, $Cs^+$, and $NH_4^+$; $M^{6'}$ includes at least one element selected from the group consisting of Group 4 elements, Group 13 elements, and Group 14 elements; b' satisfies $0 < b' < 0.2$; c' represents the absolute value of the charge of $[M^{6'}{}_{1-b'} Mn^{4+}{}_{b'} F_{d'}]$ ions; and d' satisfies $5 < d' < 7$, $$(Ba,Sr,Ca)_2Si_5N_8:Eu \qquad (4f), \text{ and}$$

$$(Sr,Ca)LiAl_3N_4:Eu \qquad (4g).$$

9. The light emitting device according to claim 5, wherein the fifth fluorescent material comprises at least one fluorescent material selected from the group consisting of a gallate fluorescent material having a composition represented by the following formula (5a), an aluminate fluorescent material having a composition represented by the following formula (5b), a gallate fluorescent material having a composition represented by the following formula (5c), and an aluminate fluorescent material having a composition represented by the following formula (5d):

$$Ga_2O_3:Cr \qquad (5a),$$

$$Al_2O_3:Cr \qquad (5b),$$

$$ZnGa_2O_4:Cr \qquad (5c), \text{ and}$$

$$(Lu,Y,Gd,Tb)_3(Al,Ga)_5O_{12}:Ce,Cr \qquad (5d).$$

* * * * *